United States Patent
Lee et al.

(10) Patent No.: US 12,040,319 B2
(45) Date of Patent: Jul. 16, 2024

(54) DISPLAY DEVICE

(71) Applicant: Samsung Display Co., Ltd., Yongin-si (KR)

(72) Inventors: Jin Woo Lee, Yongin-si (KR); Zu Seok Oh, Yongin-si (KR); Da Sol Jeong, Yongin-si (KR); Kyung Ah Choi, Yongin-si (KR); Kyu Ri Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 374 days.

(21) Appl. No.: 17/356,323

(22) Filed: Jun. 23, 2021

(65) Prior Publication Data

US 2022/0108979 A1    Apr. 7, 2022

(30) Foreign Application Priority Data

Oct. 7, 2020  (KR) .................. 10-2020-0129606

(51) Int. Cl.

| | | |
|---|---|---|
| *H01L 25/16* | (2023.01) | |
| *H01L 23/48* | (2006.01) | |
| *H01L 23/52* | (2006.01) | |
| *H01L 23/535* | (2006.01) | |
| *H01L 27/12* | (2006.01) | |
| *H01L 33/60* | (2010.01) | |
| *H01L 33/62* | (2010.01) | |
| *G09G 3/22* | (2006.01) | |
| *H01L 33/44* | (2010.01) | |

(52) U.S. Cl.
CPC .......... *H01L 25/167* (2013.01); *H01L 23/481* (2013.01); *H01L 23/52* (2013.01); *H01L 23/535* (2013.01); *H01L 27/124* (2013.01); *H01L 33/60* (2013.01); *H01L 33/62* (2013.01); *G09G 3/22* (2013.01); *H01L 33/44* (2013.01)

(58) Field of Classification Search
CPC ..... H01L 27/124; H01L 23/52; H01L 23/535; H01L 23/481; H01L 25/167; H01L 33/62; G09G 3/22
See application file for complete search history.

(56) References Cited

U.S. PATENT DOCUMENTS

| | | | |
|---|---|---|---|
| 9,570,425 B2 | 2/2017 | Do | |
| 10,818,647 B2 | 10/2020 | Kim et al. | |
| 2013/0027623 A1* | 1/2013 | Negishi | ............... H01L 25/0753 438/30 |

(Continued)

FOREIGN PATENT DOCUMENTS

| | | |
|---|---|---|
| KR | 10-1436123 B1 | 11/2014 |
| KR | 10-2018-0007025 A | 1/2018 |

(Continued)

*Primary Examiner* — Feifei Yeung Lopez
(74) *Attorney, Agent, or Firm* — Lewis Roca Rothgerber Christie LLP

(57) ABSTRACT

A display device is provided. The display device includes: a substrate; a first electrode located on the substrate; a second electrode located between the substrate and the first electrode; a first light emitting element located on the same layer as the first electrode; and a contact electrode located on the first light emitting element, wherein one end of the first light emitting element contacts the first electrode, and the other end of the first light emitting element contacts the contact electrode.

20 Claims, 14 Drawing Sheets

(56) References Cited

U.S. PATENT DOCUMENTS

| | | | |
|---|---|---|---|
| 2018/0019369 A1* | 1/2018 | Cho | ............... H05K 1/11 |
| 2018/0019426 A1* | 1/2018 | Im | ............ H01L 25/0753 |
| 2018/0198018 A1* | 7/2018 | Kim | ............ H01L 33/0095 |
| 2020/0020741 A1 | 1/2020 | Woo | |
| 2021/0407970 A1 | 12/2021 | Lee et al. | |

FOREIGN PATENT DOCUMENTS

| | | |
|---|---|---|
| KR | 10-2020-0008075 A | 1/2020 |
| KR | 10-2020-0023328 A | 3/2020 |
| KR | 10-2022-0002797 A | 1/2022 |

* cited by examiner

DISPLAY DEVICE

CROSS-REFERENCE TO RELATED APPLICATION

This application claims priority to, and the benefit of, Korean Patent Application No. 10-2020-0129606 filed in the Korean Intellectual Property Office on Oct. 7, 2020, the entire contents of which are incorporated herein by reference.

BACKGROUND

1. Field

The present disclosure relates to a display device.

2. Description of the Related Art

Recently, as interest in information display is increasing, research and development for display devices are continuously conducted.

SUMMARY

The present disclosure provides a high resolution display device that may simplify a manufacturing process by reducing the number of masks.

The aspects of the present disclosure are not limited to the aspects mentioned above, and other aspects that are not explicitly mentioned may be clearly understood to a person of an ordinary skill in the art using the following description.

Some embodiments of the present disclosure provides a display device including a substrate, a first electrode on the substrate, a second electrode between the substrate and the first electrode, a first light emitting element on the same layer as the first electrode, and a contact electrode on the first light emitting element, wherein one end of the first light emitting element contacts the first electrode, and the other end of the first light emitting element contacts the contact electrode.

The first electrode may at least partially overlap the second electrode.

The first light emitting element may at least partially overlap the second electrode.

The display device may further include a passivation layer between the first electrode and the second electrode.

The first electrode may be directly on the passivation layer.

The first light emitting element may be directly on the passivation layer.

The display device may further include a third electrode on the substrate, and a second light emitting element on the third electrode.

One end of the second light emitting element may contact the third electrode, and the other end of the second light emitting element may contact the contact electrode.

The first electrode and the third electrode may be on the same layer.

The contact electrode may surround the third electrode in a plan view.

The third electrode may overlap the second electrode.

The contact electrode may be between the first electrode and the third electrode.

The contact electrode may overlap the second electrode.

The display device may further include a passivation layer between the second electrode and the third electrode.

The third electrode may contact the second electrode through a contact hole penetrating through the passivation layer.

At least one of the first electrode, the third electrode, and the contact electrode may be electrically connected to the second electrode.

The display device may further include an insulation layer directly covering the first electrode and the contact electrode.

The first light emitting element may include a semiconductor core, and an electrode layer on one side of the semiconductor core and contacting the first electrode.

The semiconductor core may include a first semiconductor layer, a second semiconductor layer on the first semiconductor layer, and an active layer between the first semiconductor layer and the second semiconductor layer.

The display device may further include a gate electrode on the substrate, a semiconductor pattern on the gate electrode, and a source electrode and a drain electrode on the semiconductor pattern, wherein the second electrode is on the same layer as the source electrode and the drain electrode.

Particularities of other embodiments are included in the detailed description and drawings.

According to some embodiments of the present disclosure, it is possible to reduce or minimize the likelihood of a short circuit defect that may otherwise occur due to space limits between alignment electrodes by configuring the alignment electrodes for aligning light emitting elements as a plurality of conductive layers. Therefore, because a pixel area of each pixel may be more efficiently utilized, a high resolution and fine pitch display device may be realized.

In addition, because a separate contact electrode for electrically connecting the light emitting elements and the alignment electrodes may be omitted by directly locating the light emitting elements on the alignment electrodes, it is possible to reduce the number of masks to reduce costs and simplify a manufacturing process.

Aspects of embodiments of the present disclosure are not limited by what is illustrated in the above, and more various effects are included in the present specification.

DETAILED DESCRIPTION

Figure 1:
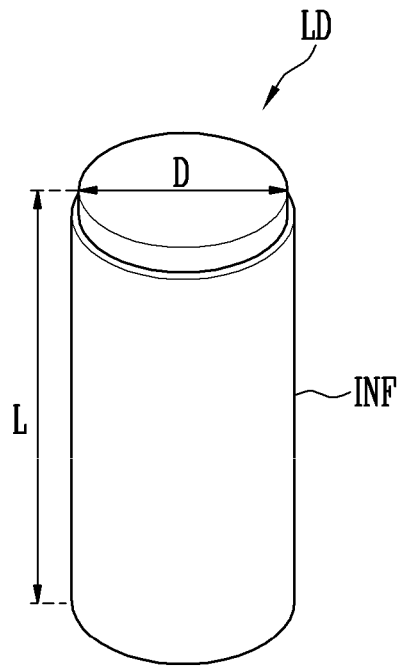
FIG. 1 to FIG. 3 illustrate a perspective view and cross-sectional views of a light emitting element according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
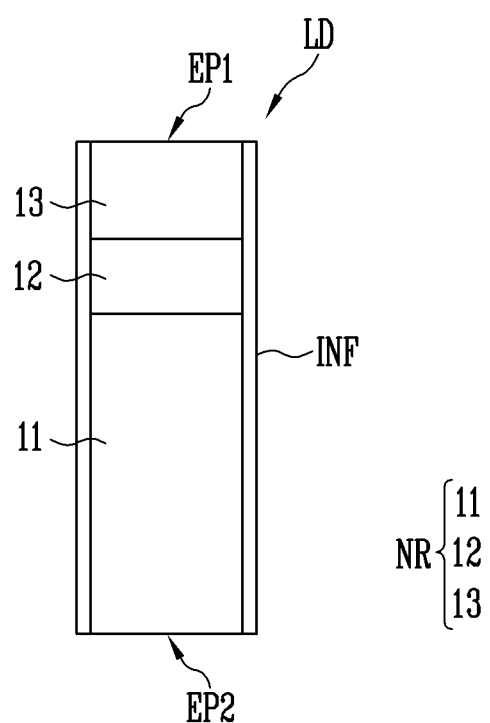
Figure 3:
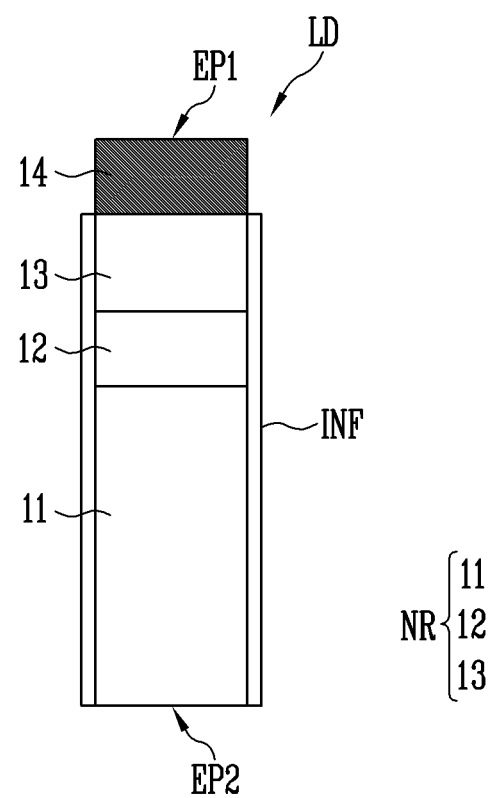

FIG. 1 to FIG. 3 illustrate a perspective view and cross-sectional views of a light emitting element according to some embodiments. FIG. 1 to FIG. 3 illustrate a cylindrical shape light emitting element LD, but a type and/or shape of the light emitting element LD is not limited thereto.

Referring to FIG. 1 and FIG. 3, a light emitting element LD may include a semiconductor core NR and an insulation film INF surrounding the semiconductor core NR.

The semiconductor core NR may include a first semiconductor layer 11, a second semiconductor layer 13, and an active layer 12 interposed between the first and second semiconductor layers 11 and 13. For example, when an extending direction of the light emitting element LD is referred to as a length L direction, the semiconductor core NR may include the first semiconductor layer 11, the active layer 12, and the second semiconductor layer 13 sequentially stacked along the length L direction.

The light emitting element LD may be provided to have a cylindrical shape extending along one direction. The light emitting element LD may have a first end portion EP1 and a second end portion EP2. One of the first and second semiconductor layers 11 and 13 may be located on the first end portion EP1 of the light emitting element LD. The other of the first and second semiconductor layers 11 and 13 may be located on the second end portion EP2 of the light emitting element LD.

In some embodiments, the light emitting element LD may be a light emitting element manufactured in a cylindrical shape through an etching method or the like. In the present specification, the "cylindrical shape" includes a rod-like shape or bar-like shape that is long in the length L direction (e.g., with an aspect ratio that is greater than 1), such as a circular cylinder or a polygonal cylinder, but a shape of a cross-section thereof is not particularly limited. For example, the length L of the light emitting element LD may be larger than a diameter D thereof (or a width of a lateral cross-section thereof).

The light emitting element LD may have a size that is as small as a nanometer scale to a micrometer scale. For example, the light emitting element LD may each have the diameter D (or width) and/or the length L ranging from a nanometer scale to a micrometer scale. However, the size of the light emitting element LD is not limited thereto, and the size of the light emitting element LD may be variously changed according to design conditions of various devices using a light emitting device using the light emitting element LD as a light source, for example, a display device.

The first semiconductor layer 11 may be a first conductive semiconductor layer. For example, the first semiconductor layer 11 may include an N-type semiconductor layer. For example, the first semiconductor layer 11 may include a semiconductor material of one of InAlGaN, GaN, AlGaN, InGaN, AlN, and/or InN, and may include a N-type semiconductor layer doped with a first conductive dopant such as Si, Ge, Sn, or the like. However, the material included in the first semiconductor layer 11 is not limited thereto, and the first semiconductor layer 11 may be made of various materials.

The active layer 12 is located on the first semiconductor layer 11, and may be formed to have a single-quantum or multi-quantum well structure. A position of the active layer 12 may be variously changed according to a type of the light emitting element LD.

In some embodiments, a clad layer doped with a conductive dopant may be formed at an upper portion and/or a lower portion of the active layer 12. For example, the cladding layer may be formed of AlGaN or InAlGaN. In some embodiments, a material such as AlGaN and/or InAlGaN may be used to form the active layer 12, and in addition, various materials may form the active layer 12.

The second semiconductor layer 13 is located on the active layer 12, and may include a semiconductor layer of a type that is different from that of the first semiconductor layer 11. For example, the second semiconductor layer 13 may include a P-type semiconductor layer. For example, the second semiconductor layer 13 may include at least one semiconductor material of InAlGaN, GaN, AlGaN, InGaN, AlN, and/or InN, and may include a P-type semiconductor layer doped with a second conductive dopant such as Mg. However, the material included in the second semiconductor layer 13 is not limited thereto, and the second semiconductor layer 13 may be made of various materials.

When a voltage of a threshold voltage or more is applied to respective ends of the light emitting element LD, the light emitting device LD emits light while electron-hole pairs are combined in the active layer 12. By controlling the light emission of the light emitting element LD by using this principle, the light emitting element LD may be used as a light source for various light emitting devices in addition to pixels of a display device.

In some embodiments, the light emitting element LD may further include the insulation film INF provided on a surface of the semiconductor core NR. The insulation film INF may be formed on the surface of the light emitting device LD so as to surround at least an outer circumferential surface of the active layer 12, and may further surround a respective region of the first and second semiconductor layers 11 and 13.

In some embodiments, the insulation film INF may expose respective end portions of the semiconductor core NR corresponding to different polarities. For example, the insulation film INF may expose one end of each of the first and second semiconductor layers 11 and 13 respectively located at the first and second end portions EP1 and EP2 of the light emitting element LD. In other embodiments, the insulation film INF may expose side portions of the first and/or second semiconductor layers 11 and 13 adjacent to the first and second end portions EP1 and EP2 of the light emitting element LD having different polarities.

In some embodiments, the insulation film INF may be formed as a single layer or as a multilayer (for example, a double layer made of an aluminum oxide (AlOx) and a silicon oxide (SiOx)) by including at least one insulating material of a silicon oxide (SiOx), a silicon nitride (SiNx), a silicon oxynitride (SiOxNy), an aluminum oxide (AlOx), and/or a titanium oxide (TiOx), but is not limited thereto. In some embodiments, the insulation film INF may be omitted.

When the insulation film INF is provided to cover a surface of the light emitting element LD, for example, an external circumferential surface of the active layer 12, it is possible to reduce or prevent the likelihood of the active layer 12 being short-circuited with a first pixel electrode or a second pixel electrode to be described later. Therefore, electrical stability of the light emitting element LD may be secured. In addition, when the insulation film INF is provided on the surface of the light emitting element LD, it is possible to improve life-span and efficiency of the light emitting element LD by reducing or minimizing surface defects of the light emitting element LD. Further, it is possible to reduce or prevent the likelihood of an unwanted short circuit between the light emitting elements LD from occurring even when a plurality of light emitting elements LD are located in close contact with each other. According to some embodiments, the first and second semiconductor layers 11 and 13 may be exposed by the insulation layer INF. That is, the insulation layer INF may cover the active layer 12, but may be partially etched to expose one end and/or a side portion of the first and second semiconductor layers 11 and 13. However, the present disclosure is not limited thereto, and the insulation layer INF may partially cover the side portion of the first and second semiconductor layers 11 and 13.

In some embodiments, the light emitting element LD may further include an additional constituent element in addition to the semiconductor core NR and the insulation film INF. For example, as shown in FIG. 3, the light emitting element LD may further include an electrode layer 14 located on one side of the semiconductor core NR. The electrode layer 14 may be located on the second semiconductor layer 13, but is not limited thereto. In some embodiments, the electrode layer 14 may be exposed by the insulation film INF. That is, the insulation layer INF may cover the semiconductor core NR, and may be partially etched to expose an end and a side portion of the electrode layer 14. However, the present disclosure isn't limited thereto, and the insulation layer INF may partially cover the side portion of the electrode layer 14 in other embodiments.

The electrode layer 14 may include a metal or metal oxide. For example, the electrode layer 14 may include Cr, Ti, Al, Au, Ni, ITO, IZO, ITZO, and/or an oxide or alloy thereof, but is not limited thereto. In addition, the electrode layer 14 may be substantially transparent or translucent. Accordingly, light generated by the active layer 12 of the light emitting element LD may pass through the electrode layer 14 to be emitted to the outside of the light emitting element LD.

Meanwhile, FIG. 1 to FIG. 3 illustrate the cylindrical shape light emitting element LD, but the type, structure, and/or shape of the light emitting element LD may be variously changed. For example, the light emitting element LD may be formed in a core-shell structure having a polygonal horn shape.

A light emitting device including the light emitting element LD described above may be used in various types of devices that require a light source in addition to a display device. For example, a plurality of light emitting elements LD may be located in each pixel of a display panel, and the light emitting elements LD may be used as a light source of each pixel. However, an application field of the light emitting element LD is not limited to the above-described example. For example, the light emitting element LD may be used in other types of devices that use a light source, such as a lighting device.

Figure 4:
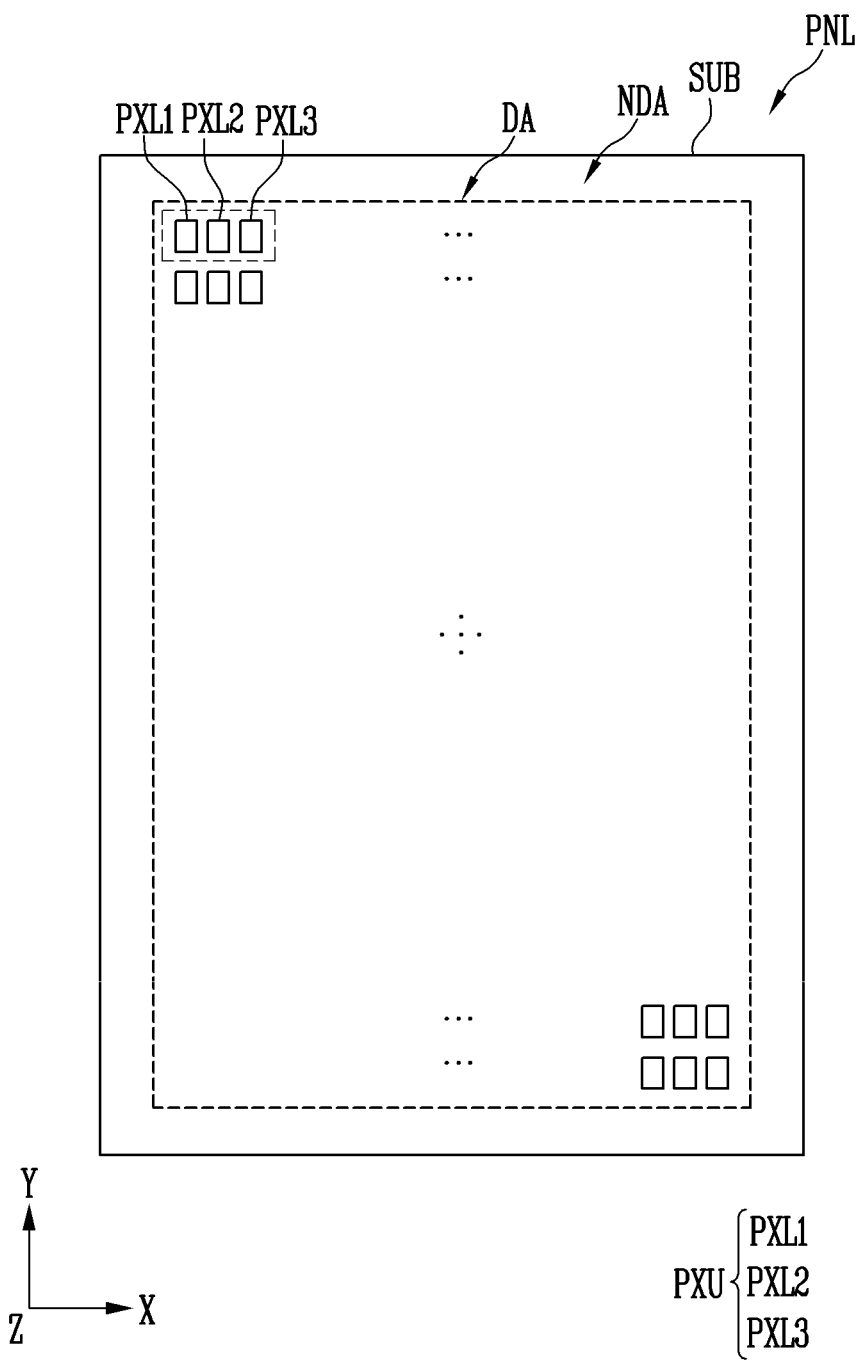
FIG. 4 illustrates a top plan view of a display device according to some embodiments.

FIG. 4 illustrates a top plan view of a display device according to some embodiments.

FIG. 4 illustrates a display device, in particular, a display panel PNL provided in the display device as an example of an electronic device that may use the light emitting element LD described in the embodiments of FIG. 1 to FIG. 3 as a light source.

Each pixel unit PXU of the display panel PNL and each pixel configuring the same may include at least one light emitting element LD. For convenience, FIG. 4 briefly illustrates a structure of the display panel PNL based on a display area DA. However, in some embodiments, at least one driving circuit portion (for example, at least one of a scan driver and a data driver), wires, and/or pads may be further located in the display panel PNL.

Referring to FIG. 4, the display panel PNL may include a substrate SUB and the pixel unit PXU located on the substrate SUB. The pixel unit PXU may include first pixels PXL1, second pixels PXL2, and/or third pixels PXL3. Hereinafter, when arbitrarily referring to one or more pixels among the first pixels PXL1, the second pixels PXL2, and the third pixels PXL3, or when comprehensively referring to two or more types of pixels, they will be referred to as a "pixel PXL" or "pixels PXL."

The substrate SUB configures a base member of the display panel PNL, and may be a rigid or flexible substrate or film. For example, the substrate SUB may be a hard substrate made of glass or tempered glass, a flexible substrate (or a thin film) made of a plastic or metallic material, or at least one layered insulation layer. The material and/or physical properties of the substrate SUB are not particularly limited.

In some embodiments, the substrate SUB may be substantially transparent. Here, "substantially transparent" may mean that light may be transmitted at a corresponding transmittance or more. In other embodiments, the substrate SUB may be translucent or opaque. In addition, the substrate SUB may include a reflective material according to some embodiments.

The display panel PNL and the substrate SUB for forming the display panel include a display area DA for displaying an image, and a non-display area NDA excluding the display area DA.

The pixels PXL may be located in the display area DA. In the non-display area NDA, various wires connected to the pixels PXL of the display area DA, pads, and/or internal circuit parts may be located. The pixels PXL may be regularly arranged according to a stripe or PenTile®/PEN-TILE® arrangement structure (PENTILE® is a registered trademark owned by Samsung Display Co., Ltd.). However, the arrangement structure of the pixels PXL is not limited thereto, and the pixels PXL may be arranged in the display area DA in various structures and/or methods.

In some embodiments, two or more types of pixels PXL for emitting light of different colors may be located in the display area DA. For example, in the display area DA, the first pixels PXL1 for emitting light of the first color, the second pixels PXL2 for emitting light of the second color, and the third pixels PXL3 for emitting light of the third color may be arranged. At least one first to third pixels PXL1, PXL2, and PXL3 located to be adjacent to each other may form one pixel unit PXU that may emit light of various colors. For example, each of the first to third pixels PXL1, PXL2, and PXL3 may be a sub-pixel for emitting light of a color (e.g., a predetermined color). In some embodiments, the first pixel PXL1 may be a red pixel that emits red light, the second pixel PXL2 may be a green pixel that emits green light, and the third pixel PXL3 may be a blue pixel that emits blue light, but the present disclosure is not limited thereto.

In some embodiments, the first to third pixels PXL1, PXL2, and PXL3 are provided with a first color light emitting element, a second color light emitting element, and a third color light emitting element as a light source, respectively, so that they respectively emit light of the first color, second color, and third color. In other embodiments, the first to third pixels PXL1, PXL2, and PXL3 are provided with light emitting elements of the same color, and include color conversion layers and/or color filters of different colors located on respective light emitting elements, so that they may emit light of the first color, the second color, and the third color, respectively. However, the color, type, and/or number of pixels PXL configuring each pixel unit PXU are not particularly limited. That is, the color of light emitted by each pixel PXL may be variously changed.

The pixel PXL may include at least one light source driven by a control signal (e.g., a predetermined control signal, such as a scan signal and/or a data signal) and/or a power source (e.g., a predetermined power source, such as a first power source and/or a second power source). In some embodiments, the light source may include at least one light emitting device LD according to one of the embodiments of FIG. 1 to FIG. 3, for example, ultra-small cylindrical shape light emitting elements LD having a size as small as nanometer scale to micrometer scale. However, the present disclosure is not limited thereto, and various types of light emitting elements LD may be used as a light source of the pixel PXL.

In some embodiments, each pixel PXL may be configured as an active pixel. However, the type, structure, and/or driving method of pixels PXL that may be applied to the display device are not particularly limited. For example, each pixel PXL may be configured as a pixel of a passive or active light emitting display device of various structures and/or driving methods.

Figure 5:
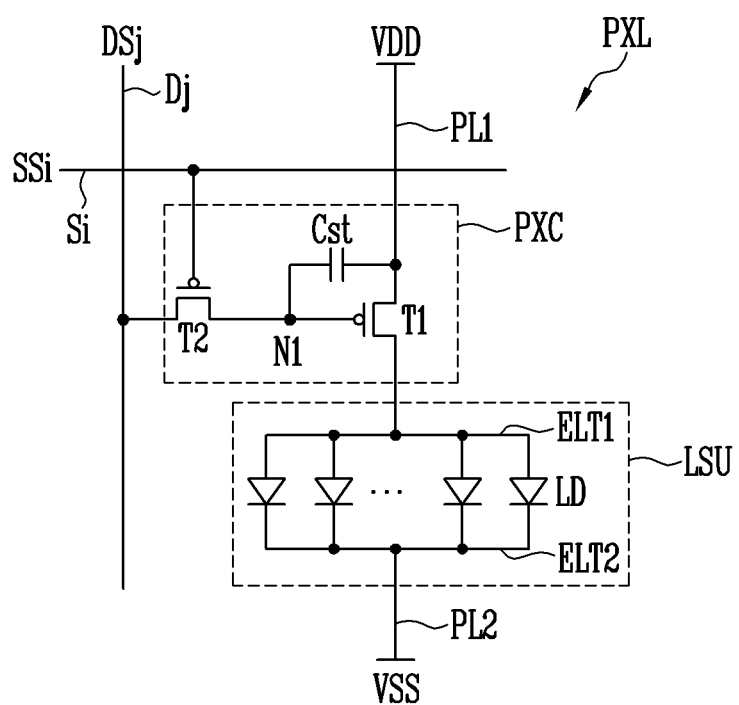
FIG. 5 to FIG. 7 illustrate circuit diagrams of a pixel according to some embodiments.
Figure 6:
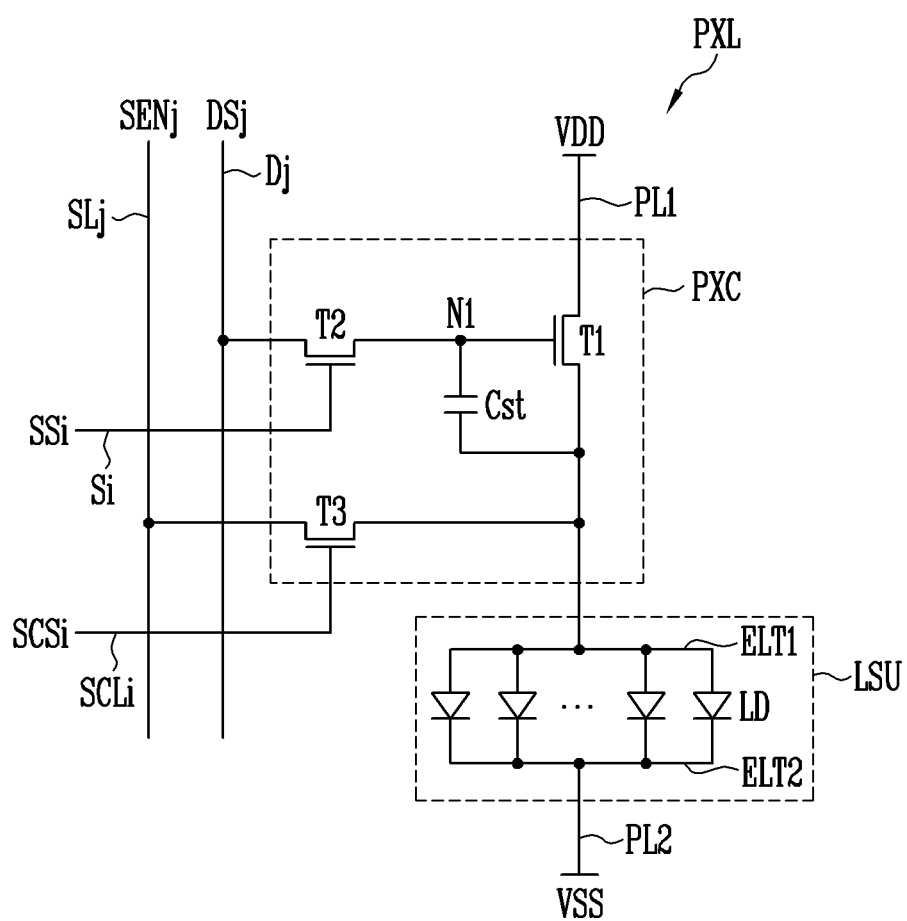
Figure 7:
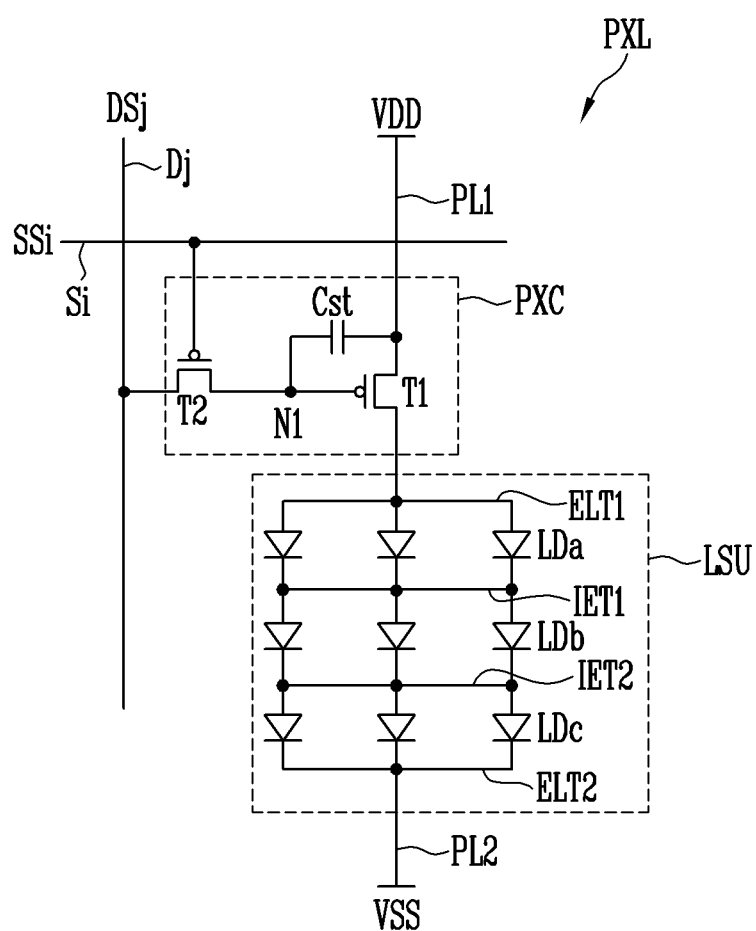

FIG. 5 to FIG. 7 illustrate circuit diagrams of a pixel according to some embodiments. For example, FIG. 5 to FIG. 7 illustrate a pixel PXL applicable to an active display device. However, the types of the pixel PXL and of the display device are not limited thereto.

In some embodiments, the pixel PXL shown in FIG. 5 to FIG. 7 may be one of the first to third pixels PXL1, PXL2, and PXL3 provided in the display panel PNL of FIG. 4. The first to third pixels PXL1, PXL2, and PXL3 may have substantially the same or similar structure.

Referring to FIG. 5, the pixel PXL may include a light source unit LSU for generating light at luminance corresponding to a data signal, and a pixel circuit PXC for driving a light source unit LSU.

The light source unit LSU may include at least one light emitting element connected between a first power source VDD and a second power source VSS. For example, the light source unit LSU may include a first electrode ELT1 (also referred to as a "first pixel electrode" or "first alignment electrode") connected to the first power VDD via the pixel circuit PXC and a first power line PL1, may include a second electrode ELT2 (also referred to as a "second pixel electrode" or "second alignment electrode") connected to the second power VSS through a second power line PL2, and also may include a plurality of light emitting elements LD electrically connected between the first and second electrodes ELT1 and ELT2. In some embodiments, the first electrode ELT1 may be an anode electrode, and the second electrode ELT2 may be a cathode electrode.

Each of the light emitting elements LD may include a first end portion (for example, a P-type end portion) connected to the first power source VDD through the first electrode ELT1 and/or the pixel circuit PXC, and a second end portion (for example, an N-type end portion) connected to the second power source VSS through the second electrode ELT2. That is, the light emitting elements LD may be connected in parallel in a forward direction between the first and second electrodes ELT1 and ET2. Respective light emitting elements LD connected in the forward direction between the first power source VDD and the second power source VSS configure respective effective light sources, and these effective light sources may be combined to configure the light source unit LSU of the pixel PXL.

The first and second power sources VDD and VSS may have different potentials so that the light emitting elements LD may emit light. For example, the first power source VDD may be set as a high potential power source, and the second power source VSS may be set as a low potential power source. In this case, a potential difference between the first and second power source sources VDD and VSS may be set to be equal to, or higher than, a threshold voltage of the light emitting elements LD during at least a light emitting period of the pixel PXL.

One end portions (for example, P-type end portions) of the light emitting elements LD configuring each light source unit LSU may be commonly connected to the pixel circuit PXC through one electrode of the light source unit LSU (for example, the first pixel electrode ET1 of each pixel PXL), and may be connected to the first power source VDD through the pixel circuit PXC and the first power line PL1. The other end portions (for example, N-type end portions) of the light emitting elements LD may be commonly connected to the second power source VSS through the other electrode of the light source unit LSU (for example, the second electrode ELT2 of each pixel PXL) and the second power wire PL2.

The light emitting elements LD may emit light with luminance corresponding to a driving current supplied through the corresponding pixel circuit PXC. For example, during each frame period, the pixel circuit PXC may supply a driving current corresponding to a gray value to be displayed in the corresponding frame to the light source unit LSU. The driving current supplied to the light source unit LSU may be divided or apportioned to flow in the light emitting elements LD that are connected in a forward direction. Therefore, while each light emitting element LD emits light with a luminance corresponding to the current flowing therein, the light source unit LSU may emit light having a luminance corresponding to the driving current.

The pixel circuit PXC may be connected between the first power source VDD and the first electrode ELT1. The pixel circuit PXC may be connected to a scan line Si and a data line Dj of the pixel PXL. For example, when the pixel PXL is located in an i-th horizontal line (row) (i is a natural number) and a j-th vertical line (column) (j is a natural number) of the display area DA, the pixel circuit PXC of the pixel PXL may be connected to an i-th scan line Si and a j-th data line Dj of the display area DA.

In some embodiments, the pixel circuit PXC may include a plurality of transistors and at least one capacitor. For example, the pixel circuit PXC may include a first transistor T1, a second transistor T2, and a storage capacitor Cst.

The first transistor T1 may be connected between the first power source VDD and the light source unit LSU. For example, a first electrode (for example, a source electrode) of the first transistor T1 may be connected to the first power source VDD, and a second electrode (for example, a drain electrode) of the first transistor T1 may be connected to the first electrode ELT1. A gate electrode of the first transistor T1 is connected to a first node N1. The first transistor T1 may control a driving current supplied to the light source unit LSU in response to a voltage of the first node N1. That is, the first transistor T1 may be a driving transistor that controls a driving current of the pixel PXL.

The second transistor T2 may be connected between the data line Dj and the first node N1. For example, a first electrode (for example, a source electrode) of the second transistor T2 may be connected to the data line Dj, and a second electrode (for example, a drain electrode) of the second transistor T2 may be connected to the first node N1. A gate electrode of the second transistor T2 may be connected to the scan line Si. When a scan signal SSi of a gate-on voltage (for example, a low level voltage) is supplied from the scan line Si, the second transistor T2 may be turned on to electrically connect the data line Dj and the first node N1.

For each frame period, a data signal DSj of the corresponding frame is supplied to the data line Dj, and the data signal DSj may be transmitted to the first node N1 through the turned-on transistor T2 during a period in which the scan signal SSi of the gate-on voltage is supplied. That is, the second transistor T2 may be a switching transistor for transmitting each data signal DSj to the inside of the pixel PXL.

One electrode of the storage capacitor Cst may be connected to the first power source VDD, and the other electrode thereof is connected to the first node N1. The storage capacitor Cst may be charged with a voltage the corresponding to the data signal DSj supplied to the first node N1 during each frame period.

Meanwhile, in FIG. 5, the transistors included in the pixel circuit PXC, for example, the first and second transistors T1 and T2 are all illustrated as P-type transistors, but are not necessarily limited thereto, and a least one of the first and second transistors T1 and T2 may be changed to an N-type transistor. In addition, the pixel circuit PXC may be configured as a pixel circuit having various structures and/or driving methods in other embodiments.

Referring to FIG. 6, the pixel circuit PXC may be further connected to a sensing control line SCLi and a sensing line SLj. For example, the pixel circuit PXC of the pixel PXL located at an i-th horizontal line and a j-th vertical line of the display area DA may be connected to an i-th sensing control line SCLi and a j-th sensing line SLj of the display area DA. The pixel circuit PXC may further include a third transistor T3. Alternatively, in other embodiments, the sensing line SLj may be omitted, and the characteristics of the pixel PXL may also be detected by detecting a sensing signal SENj through the data line Dj of the corresponding pixel PXL (or the data line of an adjacent pixel).

The third transistor T3 is connected between the first transistor T1 and the sensing line SLj. For example, one electrode of the third transistor T3 may be connected to one electrode (for example, a source electrode) of the first transistor T1 connected to the first electrode ELT1, and the other electrode thereof may be connected to the sensing line SLj. Meanwhile, when the sensing line SLj is omitted in other embodiments, the other electrode of the third transistor T3 may be connected to the data line Dj.

A gate electrode of the third transistor T3 is connected to the sensing control line SCLi. When the sensing control line SCLi is omitted in other embodiments, the gate electrode of the third transistor T3 may be connected to the scan line Si. The third transistor T3 is turned on by a sensing control signal SCSi of a gate-on voltage (for example, a high level voltage) supplied to the sensing control line SCLi during a sensing period (e.g., a predetermined sensing period) to electrically connect the sensing line SLj and the first transistor T1.

In some embodiments, the sensing period may be a period for extracting characteristics (for example, a threshold voltage of the first transistor T1) of each of the pixels PXL located in the display area DA. During the sensing period, the first transistor T1 may be turned on by supplying a reference voltage (e.g., a predetermined reference voltage), at which the first transistor T1 may be turned on, to the first node N1 through the data line Dj and the second transistor T2, and by connecting each pixel PXL to a current source or the like.

In addition, by supplying the sensing control signal SCSi of a gate-on voltage to the third transistor T3 to turn on the third transistor T3, the first transistor T1 may be connected to the sensing line SLj. Thereafter, the sensing signal SENj is obtained through the sensing line SLj, and the characteristics of each pixel PXL, in addition to the threshold voltage of the first transistor T1, may be detected by using the sensing signal SENj. Information on the characteristics of each pixel PXL may be used to convert image data so that a characteristic difference between the pixels PXL located in the display area DA may be compensated.

Meanwhile, FIG. 6 illustrates a case in which the first to third transistors T1, T2, and T3 are all N-type transistors, but the present disclosure is not limited thereto. For example, at least one of the first to third transistors T1, T2, and T3 may be changed to a P-type transistor.

In addition, FIG. 5 and FIG. 6 illustrate the embodiments in which effective light sources forming each light source unit LSU, that is, the light emitting elements LD, are all connected in parallel, but the present disclosure is not necessarily limited thereto. For example, as shown in FIG. 7, the light source unit LSU of each pixel PXL may be configured to include at least two stages coupled in series. In describing embodiments of FIG. 7, a detailed description of the configuration (for example, the pixel circuit PXC) that is similar to, or the same as, the embodiments of FIG. 5 and FIG. 6 will not be repeated.

Referring to FIG. 7, the light source unit LSU may include at least two light emitting elements that are connected in series to each other. For example, the light source unit LSU may include a first light emitting element LDa, a second light emitting element LDb, and a third light emitting element LDc that are connected in series in a forward direction between the first power source VDD and the second power source VSS. The first to third light emitting elements LDa, LDb, and LDc may configure an effective light source, respectively.

Hereinafter, when referring to a specific light emitting element among the first to third light emitting elements LDa, LDb, and LDc, the corresponding light emitting element is referred to as a "first light emitting element LDa", "second light emitting element LDb", or "third light-emitting element LDc". In addition, when arbitrarily referring to at least one light emitting element among the first to third light emitting elements LDa, LDb, and LDc, or when comprehensively referring to the first to third light emitting elements LDa, LDb, and LDc, it will be referred to as a "light emitting element LD" or "light emitting elements LD".

A first end portion (for example, a P-type end portion) of the first light emitting element LDa is connected to the first power source VDD via the first electrode ELT1 (that is, the first pixel electrode) of the light source unit LSU. In addition, a second end portion (for example, a N-type end portion) of the first light emitting element LDa is connected to a first end portion (for example, a P-type end portion) of the second light emitting element LDb through a first middle electrode IET1.

The first end portion of the second light emitting element LDb is connected to a second end portion of the first light emitting element LDa. In addition, the second end portion (for example, a N-type end) of the second light emitting element LDb is connected to a first end portion (for example, a P-type end portion) of the third light emitting element LDc through a second middle electrode IET2.

The first end portion of the third light emitting element LDc is connected to a second end portion of the second light emitting element LDb. In addition, a second end portion of the third light emitting element LDc (for example, a N-type end portion) may be connected to the second power supply VSS via the second electrode (that is, the second pixel electrode ELT2) of the light source unit LSU. In the above-described manner, the first, second, and third light emitting elements LDa, LDb, and LDc may be sequentially connected in series between the first and second electrodes ELT1 and ELT2 of the light source unit LSU.

Meanwhile, FIG. 7 illustrates some embodiments of connecting the light emitting elements LD in a three-stage serial structure, but the present disclosure is not limited thereto. For example, two light emitting elements LD may be connected in a two-stage serial structure, or four or more of light emitting elements LD may be connected in a series structure of four or more stages.

Assuming that the same luminance is expressed using the light-emitting elements LD of the same condition (for example, the same size and/or number), in the light source unit LSU having a structure in which the light emitting elements LD are connected in series, as compared to the light source unit LSU having a structure in which the light emitting elements LD are connected in parallel, a voltage applied between the first and second electrodes ELT1 and ELT2 may increase, and a driving current flowing through the light source unit LSU may decrease. Therefore, when the light source unit LSU of each pixel PXL is configured by applying the serial structure, a panel current flowing through the display panel PNL may be reduced.

As in the above-described embodiment, each light source unit LSU is connected to the first and second power sources VDD and VSS in a forward direction to be able to include a plurality of light emitting elements LD configuring each effective light source. In addition, the connection structure between the light emitting elements LD may be variously changed according to embodiments. For example, the light emitting elements LD may be connected to each other only in series or in parallel, or may be connected in a series/parallel mixed structure.

Figure 8:
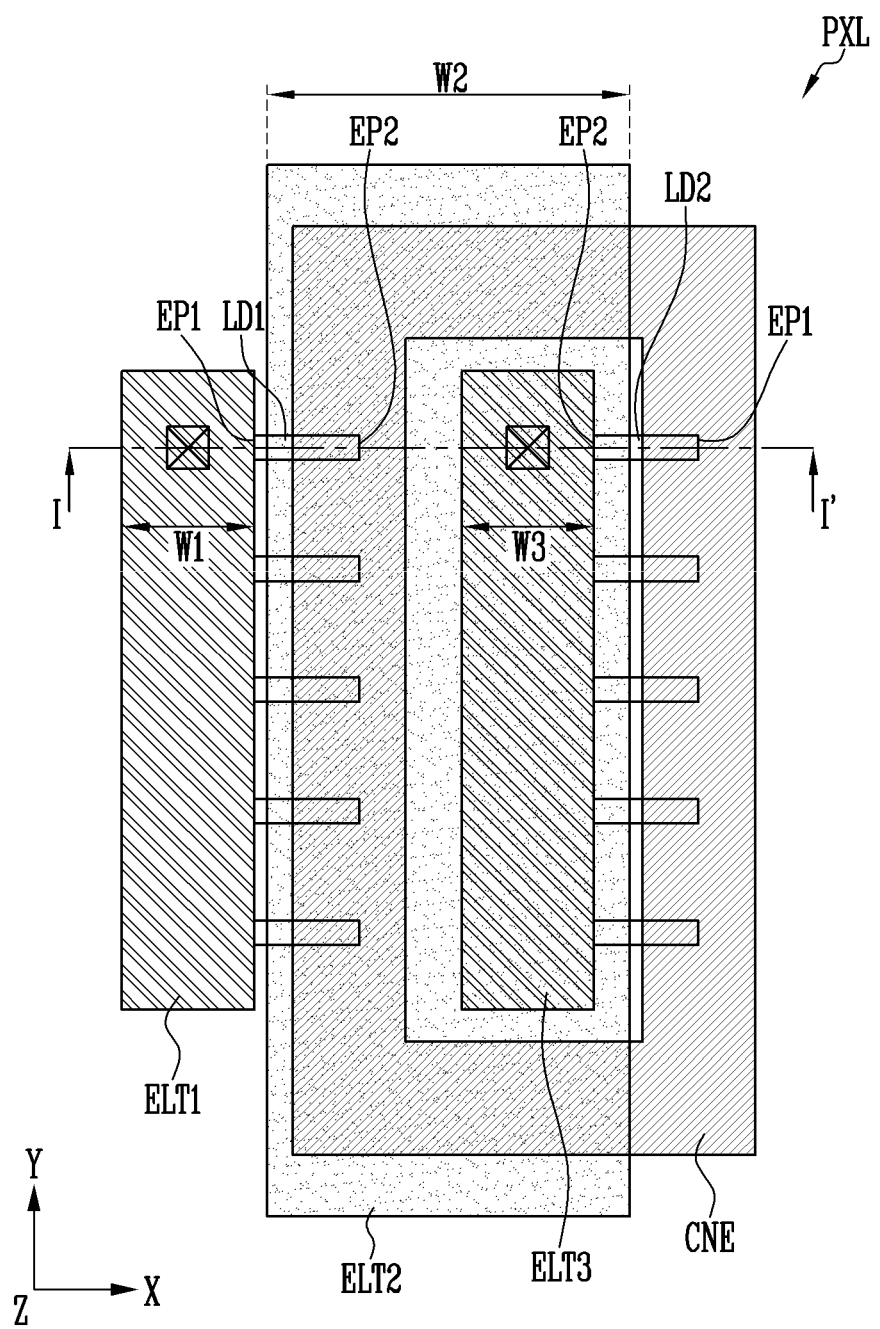
FIG. 8 illustrates a top plan view of a pixel according to some embodiments.

FIG. 8 illustrates a top plan view of a pixel according to some embodiments.

Referring to FIG. 8, the pixel PXL may include the first electrode ELT1, the second electrode ELT2, and a third electrode ELT3 arranged in a first direction (X-axis direction).

The first to third electrodes ELT1, ELT2, and ELT3 may extend in a second direction (Y-axis direction) crossing the first direction (X-axis direction). The first to third electrodes ELT1, ELT2, and ELT3 may have different respective widths. For example, a width W2 in the first direction (X-axis direction) of the second electrode ELT2 may be larger than a width W1 in the first direction (X-axis direction) of the first electrode ELT1 and/or a width W3 in the first direction (X-axis direction) of the third electrode ELT3. In addition, the width W1 in the first direction (X-axis direction) of the first electrode ELT1 may be substantially the same as the width W3 in the first direction (X-axis direction) of the third electrode ELT3, but the present disclosure is not limited thereto.

In some embodiments, at least one of the first to third electrodes ELT1, ELT2, and ELT3 may be located on another layer so as to overlap each other in a plan view. The drawing illustrates a case in which the first electrode ELT1 and the second electrode ELT2 are spaced apart from each other, and the third electrode ELT3 entirely overlaps the second electrode ELT2, but the present disclosure is not limited thereto. For example, in other embodiments, the first electrode ELT1 may at least partially overlap the second electrode ELT2, or the third electrode ELT3 may partially overlap the second electrode ELT2. That is, the shapes and/or mutual arrangement relationship of the first to third electrodes ELT1, ELT2, and ELT3 may be variously changed.

The first to third electrodes ELT1, ELT2, and ELT3 may be supplied with different alignment signals (or alignment voltages) in an alignment process of aligning light emitting elements LD1 and LD2. That is, the first to third electrodes ELT1, ELT2, and ELT3 may each receive first to third alignment signals (or first to third alignment voltages). However, the present disclosure is not limited thereto, and some of the first to third electrodes ELT1, ELT2, and ELT3 receive the first alignment signal (or first alignment voltage), and the remaining ones of the first to third electrodes ELT1, ELT2, and ELT3 are supplied with the second alignment signal (or second alignment voltage). For example, some of the first to third electrodes ELT1, ELT2, and ELT3 may be supplied with an alternating current (AC) type alignment signal, and the remaining ones of the first to third electrodes ELT1, ELT2, and ELT3 may be supplied with an alignment voltage (for example, ground voltage) having a constant voltage level. That is, an alignment signal (e.g., a predetermined alignment signal) may be applied to the first to third electrodes ELT1, ELT2, and ELT3 in the alignment process of the light emitting elements LD. Accordingly, an electric field may be formed between the first to third electrodes ELT1, ELT2, and ELT3. The light emitting elements LD1 and LD2 provided in each pixel area (for example, the light emitting area of each pixel PXL) may be self-aligned between the first to third electrodes ELT1, ELT2, and ELT3 by the electric field. After the alignment of the light emitting elements LD1 and LD2 is completed, by disconnecting the at least first electrodes ELT1 and/or third electrodes ELT3 between the pixels PXL, the pixels PXL may be in a form that is capable of being individually driven. Meanwhile, by configuring the first to third electrodes ELT1, ELT2, and ELT3 as a plurality of conductive layers, short circuit defects that otherwise may occur due to space limits between the first to third electrodes ELT1, ELT2, and ELT3 may be reduced or minimized. A detailed description of this will be described later with reference to FIG. 9 to FIG. 11.

In some embodiments, the light emitting elements LD1 and LD2 are prepared to be dispersed in a solution (e.g., a predetermined solution), and may be supplied to the light emitting area of each pixel PXL through an inkjet printing method or a slit coating method. For example, the light emitting elements LD1 and LD2 may be mixed with a volatile solvent, and may be supplied to each pixel PXL. After the light emitting elements LD1, and LD2 are aligned, the light emitting elements LD1 and LD2 may be stably arranged between the first to third electrodes ELT1, ELT2, and ELT3 by volatilizing the solvent or by eliminating the solvent through another method. In some embodiments, the first light emitting element LD1 may be located between the first electrode ELT1 and the second electrode ELT2. The first end portion EP1 of the first light emitting element LD1 may be adjacent to one end of the first electrode ELT1, and the second end portion EP2 of the first light emitting element LD1 may be adjacent to the one end of the second electrode ELT2. Similarly, the second light emitting element LD2 may be located between the second electrode ELT2 and the third electrode ELT3. The first end portion EP1 of the second light emitting element LD2 may be adjacent to one end of the second electrode ELT2, and the second end portion EP2 of the second light emitting element LD2 may be adjacent to the one end of the third electrode ELT3.

The first and second light emitting elements LD1 and LD2 may be electrically connected between the first electrode ELT1 and the second electrode ELT2. For example, the first end portion EP1 of the first light emitting element LD1 may be electrically connected to the first electrode ELT1. The first end portion EP1 of the first light emitting element LD1 may be directly located on the first electrode ELT1 to contact the first electrode ELT1.

In addition, the second end portion EP2 of the first light emitting element LD1 may be electrically connected to the first end portion EP1 of the second light emitting element LD2 through a contact electrode CNE. That is, one side of the contact electrode CNE may contact the second end portion EP2 of the first light emitting element LD1, and the other side of the contact electrode CNE may contact the first end portion EP1 of the second light emitting element LD2. Accordingly, the contact electrode CNE may electrically connect the second end portion EP2 of the first light emitting element LD1 and the first end portion EP1 of the second light emitting element LD2. In this case, the contact electrode CNE may be extended by bypassing the third electrode ELT3. For example, the contact electrode CNE may be spaced apart from the third electrode ELT3, and may at least partially surround the third electrode ELT3. That is, the contact electrode CNE may have a closed loop shape as a whole. However, the present disclosure is not limited thereto, and the contact electrode CNE may extend to bypass the third electrode ELT3, and may have a partially cut or opened shape in other embodiments.

In addition, the second end portion EP2 of the second light emitting element LD2 may be electrically connected to the third electrode ELT3. The second end portion EP2 of the second light emitting element LD2 may be directly located on the third electrode ELT3 to contact the third electrode ELT3. The third electrode ELT3 can be electrically connected to the second electrode ELT2 through the contact hole. That is, the first and second light emitting elements LD1 and LD2 may be connected in series between the first electrode ELT1 and the second electrode ELT2 through the contact electrode CNE. As such, the light emitting elements LD1 and LD2 connected between the first electrode ELT1 and the second electrode ELT2 may configure a light source of each pixel PXL. For example, when a driving current flows in the pixel PXL during each frame period, the light emitting elements LD1 and LD2 connected in a forward direction between the first electrode ELT1 and the second electrode ELT2 may emit light, and may emit light with luminance corresponding to the driving current.

Figure 9:
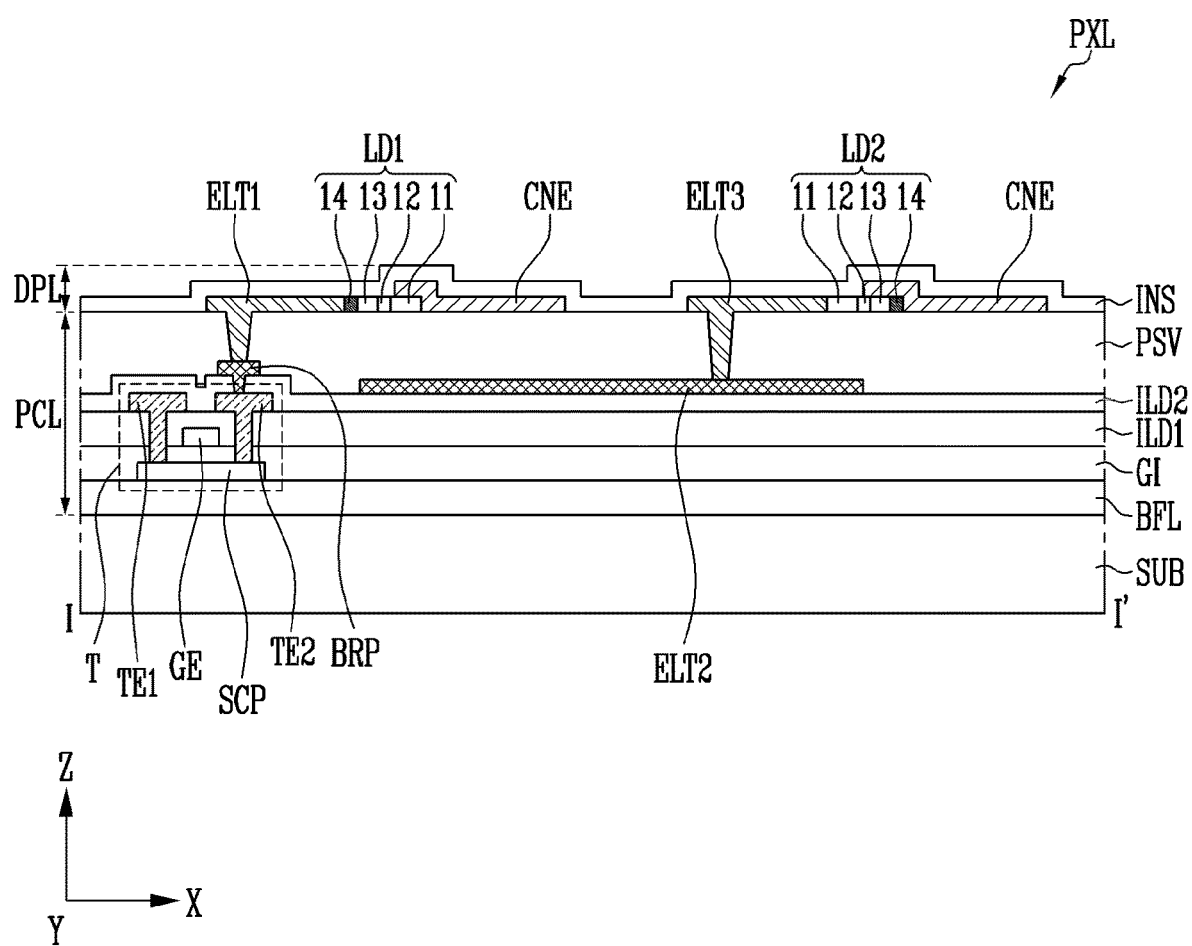
FIG. 9 to FIG. 11 illustrate cross-sectional views taken along the line I-I' of FIG. 8.
Figure 10:
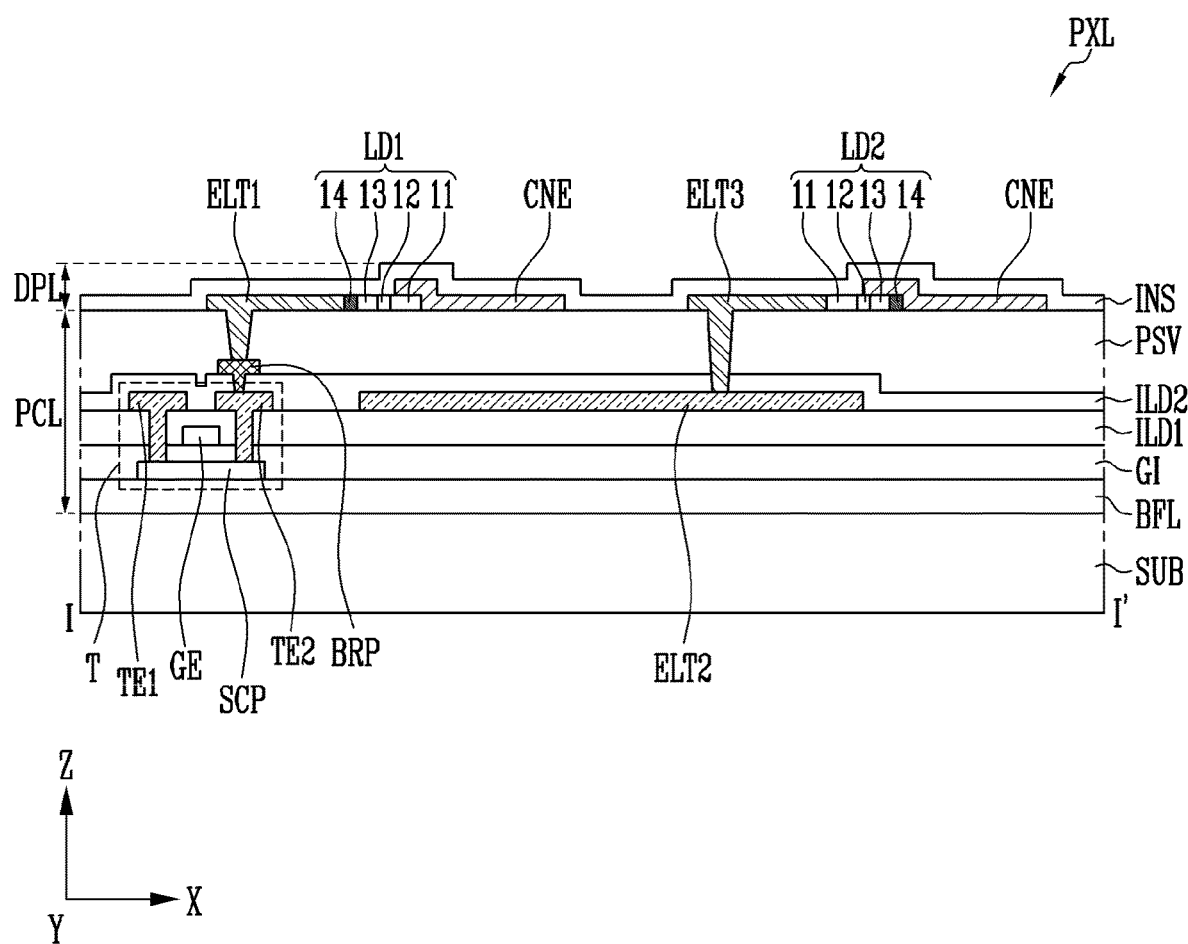
Figure 11:
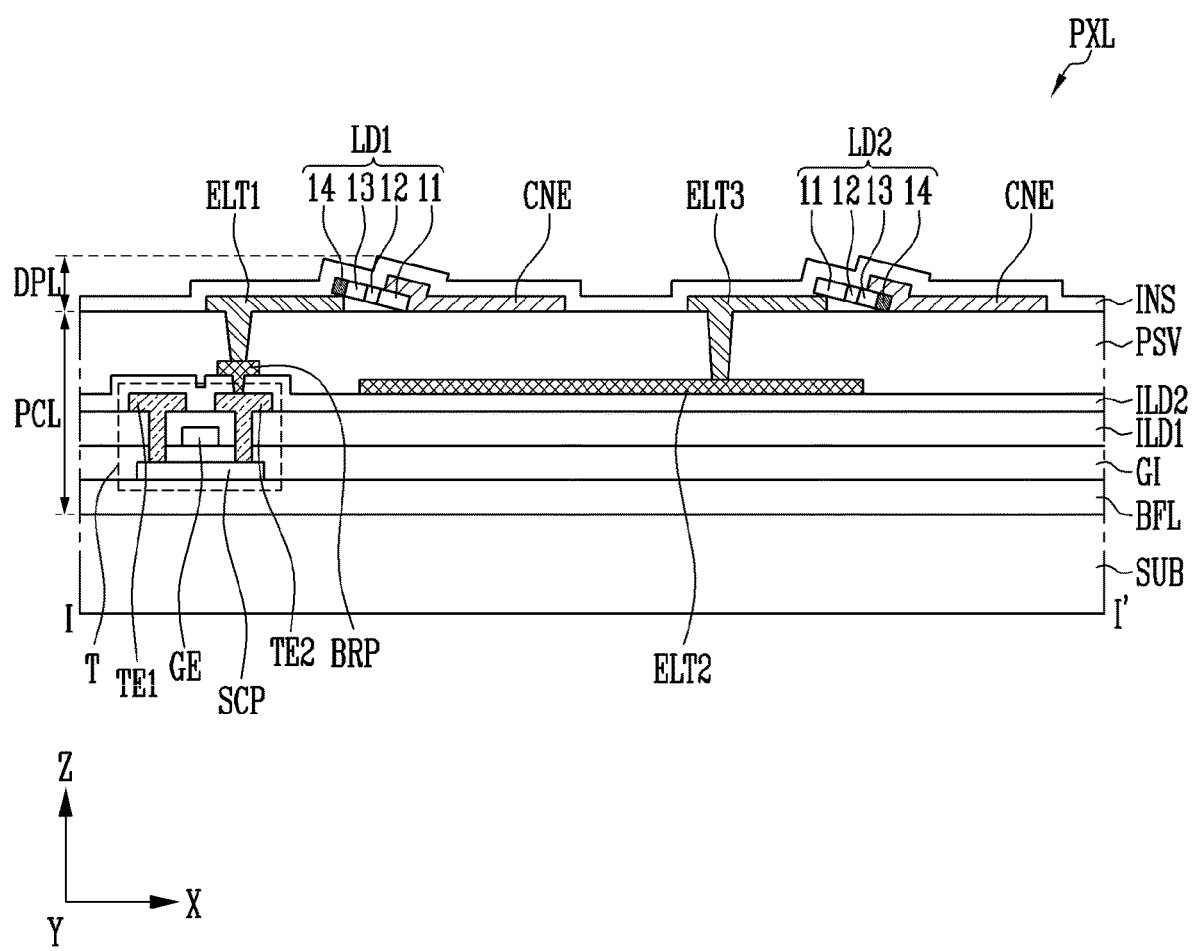

FIG. 9 to FIG. 11 illustrate cross-sectional views taken along the line I-I' of FIG. 8.

FIG. 9 to FIG. 11 schematically show a structure of each pixel PXL based on one first light emitting element LD1 and one second light emitting element LD2, and show a transistor T connected the first electrode ELT1 among various circuit elements configuring the pixel circuit PXC. Hereinafter, when it is not necessary to separately specify the first transistor T1, the first transistor T1 will also be comprehensively referred to as a "transistor T".

Meanwhile, structures of the transistors T and/or a position of each layer thereof are not limited to the embodiments shown in FIG. 9 to FIG. 11, and may be variously changed according to other embodiments. In addition, the transistors T configuring the pixel circuit PXC may have substantially the same or similar structure to each other, but are not limited thereto. For example, at least one of the transistors T included in the pixel circuit PXC may have a different cross-sectional structure from the remaining other transistors T, and/or may be located on a different layer.

Referring to FIG. 9 to FIG. 11, the pixel PXL and the display device including the same may include a substrate SUB, and a circuit layer PCL and a display layer DPL that are located on one surface of the substrate SUB. In some embodiments, a color conversion layer and/or a color filter layer may be further located on the display layer DPL, but the present disclosure is not limited thereto.

The circuit layer PCL may include at least one circuit element electrically connected to the light emitting elements LD of each pixel PXL. For example, the circuit layer PCL may include a plurality of transistors T that are located in each pixel area to form a pixel circuit PXC of a corresponding pixel PXL. In addition, the circuit layer PCL may further include at least one power wire and signal wire connected to each pixel circuit PXC and the light source unit LSU. In addition, the circuit layer PCL may include insulation layers located between a plurality of conductive layers. For example, the circuit layer PCL may include a buffer layer BFL, a gate insulation layer GI, a first interlayer insulation layer ILD1, a second interlayer insulation layer ILD2, and/or a passivation layer PSV sequentially stacked on one side of the substrate SUB.

The buffer layer BFL may reduce or prevent the diffusion of impurities into each circuit element. The buffer layer BFL may be formed as a single layer, but may also be formed as a multilayer of at least two layers or more. When the buffer layer BFL is provided as the multilayer, respective layers may be made of the same material or different materials. Various circuit elements, such as the transistors T, and various wires connected to the circuit elements, may be located on the buffer layer BFL. In some embodiments, the buffer layer BFL may be omitted.

Each transistor T may include a semiconductor pattern SCP (also referred to as a "semiconductor layer" or an "active layer"), a gate electrode GE, first and second transistor electrodes TE1 and TE2. Meanwhile, FIG. 9 to FIG. 11 illustrate some embodiments in which each transistor T includes the first and second transistor electrodes TE1 and TE2 formed separately from the semiconductor pattern SCP, but the present disclosure is not necessarily limited thereto. For example, in other embodiments, the first and/or second transistor electrodes TE1 and/or TE2 provided in at least one transistor T may be integrated with each semiconductor pattern SCP.

The semiconductor pattern SCP may be located on the buffer layer BFL. For example, the semiconductor pattern SCP may be located between the substrate SUB, on which the buffer layer BFL is formed, and the gate insulation layer GI. The semiconductor pattern SCP may include a first region contacting the first transistor electrode TE1, a second region contacting the second transistor electrode TE2, and a channel region located between the first and second regions. In some embodiments, one of the first and second regions may be a source region, and the other thereof may be a drain region.

In some embodiments, the semiconductor pattern SCP may be made of polysilicon, amorphous silicon, an oxide semiconductor, or the like. In addition, the channel region of the semiconductor pattern SCP may be an intrinsic semiconductor as a semiconductor pattern that is not doped with impurities, and each of the first and second regions of the semiconductor pattern SCP may be a semiconductor pattern doped with impurities (e.g., predetermined impurities).

In some embodiments, the semiconductor patterns SCP of the transistors T included in each pixel circuit PXC may be made of substantially the same or similar material. For example, the semiconductor pattern SCP of the transistors T may be of one material of polysilicon, amorphous silicon, and an oxide semiconductor.

In other embodiments, some of the transistors T and the remaining ones thereof may include the semiconductor patterns SCP made of different materials. For example, the semiconductor pattern SCP of some of the transistors T may be made of polysilicon or amorphous silicon, and the semiconductor pattern SCP of the remaining ones of the transistors T may be made of an oxide semiconductor.

The gate insulation layer GI may be located on the semiconductor pattern SCP. For example, the gate insulation layer GI may be located between the semiconductor pattern SCP and the gate electrode GE. The gate insulation layer GI may be formed as a single layer or as multilayer, and may include a silicon nitride (SiNx), a silicon oxide (SiOx), or a silicon oxynitride (SiOxNy), and various types of organic/inorganic insulating materials.

The gate electrode GE may be located on the gate insulation layer GI. For example, the gate electrode GE may be located to overlap the semiconductor pattern SCP with the gate insulation layer GI interposed therebetween. Although FIG. 9 to FIG. 11 illustrate a top-gate structure of transistor T, in other embodiments, the transistor T may have a bottom-gate structure. In this case, the gate electrode GE may be located to overlap the semiconductor pattern SCP while being under the semiconductor pattern SCP.

The first interlayer insulation layer ILD1 may be located on the gate electrode GE. For example, the first interlayer insulation layer ILD1 may be located between the gate electrode GE and the first and second transistor electrodes TE1 and TE2. The first interlayer insulation layer ILD1 may be formed as a single layer or as a multilayer, and may include at least one inorganic insulating material and/or organic insulating material. For example, the first interlayer insulation layer ILD1 may include a silicon nitride (SiNx), a silicon oxide (SiOx), a silicon oxynitride (SiOxNy), and/or various types of organic/inorganic insulating materials, and the materials included in the first interlayer insulation layer ILD1 are not particularly limited.

The first and second transistor electrodes TE1 and TE2 may be located on the first interlayer insulation layer ILD1. The first and second transistor electrodes TE1 and TE2 may be located on each semiconductor pattern SCP with at least one first interlayer insulation layer ILD1 therebetween. For example, the first and second transistor electrodes TE1 and TE2 may be located on different end portions of the semiconductor pattern SCP with the gate insulation layer GI and the first interlayer insulation layer ILD1 therebetween. The first and second transistor electrodes TE1 and TE2 may be electrically connected to each semiconductor pattern SCP. For example, the first and second transistor electrodes TE1 and TE2 may be respectively connected to the first and second regions of the semiconductor pattern SCP through respective contact holes passing through the gate insulation layer GI and the first interlayer insulation layer ILD1. In some embodiments, one of the first and second transistor electrodes TE1 and TE2 may be a source electrode, and the other thereof may be a drain electrode.

The second interlayer insulation layer ILD2 may be located on the first and second transistor electrodes TE1 and TE2. The second interlayer insulation layer ILD2 may be formed as a single layer or as a multilayer, and may include at least one inorganic insulating material and/or organic insulating material. For example, the second interlayer insulation layer ILD2 may include a silicon nitride (SiNx), a silicon oxide (SiOx), a silicon oxynitride (SiOxNy), and/or various types of organic/inorganic insulating materials, but the present disclosure is not limited thereto.

A bridge pattern BRP may be located on the second interlayer insulation layer ILD2. The bridge pattern BRP may electrically connect the at least one circuit element (for example, the first transistor T1) provided in the pixel circuit PXC and the first electrode ELT1.

In some embodiments, the above-described second electrode ELT2 may be located on the same layer as the bridge pattern BRP. That is, as shown in FIG. 9, the second electrode ELT2 may be formed of the same conductive layer as the bridge pattern BRP. However, the present disclosure is not limited thereto, and the second electrode ELT2 may be formed of a conductive layer that is different from the bridge pattern BRP. For example, as shown in FIG. 10, the second electrode ELT2 may be located on the same layer as the first and second transistor electrodes TE1 and TE2. That is, the second electrode ELT2 may be formed of the same conductive layer as the first and second transistor electrodes TE1 and TE2.

The passivation layer PSV may be located on the bridge pattern BRP. The passivation layer PSV may be formed as a single layer or as a multilayer, and may include at least one inorganic insulating material and/or organic insulating material. For example, the passivation layer PSV may include at least one organic insulation layer, and may serve to substantially flatten a surface of the circuit layer PCL.

The display layer DPL may be located on the passivation layer PSV of the circuit layer PCL. The display layer DPL may include the first electrode ELT1, the third electrode ELT3, the plurality of light emitting elements LD1 and LD2, and the contact electrode CNE. The first electrode ELT1, the third electrode ELT3, and the plurality of light emitting elements LD1 and LD2 may be directly located on the passivation layer PSV. That is, the first electrode ELT1, the third electrode ELT3, and the plurality of light emitting elements LD1 and LD2 may be located on the same layer.

Meanwhile, in FIG. 9 to FIG. 11, one of each of the first and second light emitting elements LD1 and LD2 are respectively shown, but as in some embodiments (e.g., see FIG. 5), a plurality of first and second light emitting elements LD1 and LD2 may be provided. Accordingly, hereinafter, assuming that the pixel PXL includes a plurality of first and second light emitting elements LD1 and LD2, respective embodiments will be described.

The first electrode ELT1 and the third electrode ELT3 may be located on the passivation layer PSV. The first electrode ELT1 and the third electrode ELT3 may be directly located on the passivation layer PSV. The first electrode ELT1 and the third electrode ELT3 may be located in each pixel area in which the pixel PXL is provided and/or formed. For example, the first electrode ELT1 and the third electrode ELT3 may be located side by side to be spaced apart from each other by an interval (e.g., a predetermined interval) in the light emitting area of each pixel PXL.

In some embodiments, the first electrode ELT1 and/or the third electrode ELT3 may have a pattern separated for each pixel PXL or a pattern that is commonly connected to a plurality of pixels PXL. On the other hand, before the process of forming the pixel PXL, for example before the alignment of the light emitting elements LD is completed, the first electrodes ELT1 of the pixels PXL located in the display area DA may be connected to each other, and the third electrodes ELT3 of the pixels PXL may be connected to each other. For example, before the alignment of the light emitting elements LD is completed, the first electrodes ELT1 of the pixels PXL may be formed integrally or non-integrally with each other to be electrically connected to each other, and the third electrodes ELT3 of the pixels PXL may be formed integrally or non-integrally with each other to be electrically connected to each other. When the first electrodes ELT1 or the third electrodes ELT3 of the pixels PXL are non-integrally connected to each other, the first electrodes ELT1 or the third electrodes ELT3 may be electrically connected to each other by at least one contact hole and/or bridge pattern.

The first electrode ELT1 and the third electrode ELT3 of the display layer DPL may receive an alignment signal (e.g., a predetermined alignment signal) together with the second electrode ELT2 of the circuit layer PCL. Accordingly, an electric field is formed between the first to third electrodes ELT1, ELT2, and ELT3, so that the light emitting elements LD may be self-aligned between respective ones of the first to third electrodes ELT1, ELT2, and ELT3. As such, when the first to third electrodes ELT1, ELT2, and ELT3 for aligning the light emitting elements LD1 and LD2 are configured as a plurality of conductive layers, short-circuit defects that may occur due to the space limits between the first to third electrodes ELT1, ELT2, and ELT3 may be reduced or minimized. Therefore, because a pixel area of each pixel PXL may be more efficiently utilized, a high resolution and fine pitch display device may be realized.

In some embodiments, the first and third electrodes ELT1 and ELT3 may function as reflective members. For example, the first and third electrodes ELT1 and ELT3 may function as a reflective member that guides light emitted from the light emitting elements LD1 and LD2 to the front of the display panel PNL, that is, in a third direction (Z-axis direction) to improve light efficiency of the display panel PNL. In some embodiments, the light emitting elements LD1 and LD2 may at least partially overlap the second electrode ELT2 in the third direction (Z-axis direction). In this case, the second electrode ELT2 may function as a reflective member. That is, the second electrode ELT2 is located under the light emitting elements LD1 and LD2 to reflect light emitted to a lower portion of the light emitting elements LD1 and LD2 to the front of the display panel PNL, that is, to the third direction (Z-axis direction), thereby improving light efficiency of the front surface of the display panel PNL.

The first electrode ELT1 may be electrically connected to a circuit element (e.g., a predetermined circuit element such as, for example, at least one transistor configuring the pixel circuit PXC), to a power line (for example, the first power line PL1), and/or to a signal line (for example, the scan line Si, the data line Dj, or a control line/predetermined control line), through a contact hole penetrating through the passivation layer PSV. In some embodiments, the first electrode ELT1 may be electrically connected to the bridge pattern BRP through the contact hole penetrating through the passivation layer PSV, and thus, it may be electrically connected to the transistor T. However, the present disclosure is not necessarily limited thereto, and the first electrode ELT1 may be directly connected to a predetermined power wire or signal wire.

The third electrode ELT3 may be electrically connected to a predetermined circuit element (for example, at least one transistor configuring the pixel circuit PXC), a power line (for example, the second power line PL2), and/or a signal line (for example, the scan line Si, the data line Dj, or a predetermined control line), through a contact hole penetrating through the passivation layer PSV. In some embodiments, the third electrode ELT3 may be electrically connected to the second electrode ELT2 through the contact hole penetrating through the passivation layer PSV, and thus, it may be electrically connected to the second power wire PL2. However, the present disclosure is not necessarily limited thereto, and the third electrode ELT3 may be directly connected to a power wire or signal wire (e.g., a predetermined power wire or signal wire). Meanwhile, in FIG. 9, the structure in which the third electrode ELT3 is electrically connected to the second electrode ELT2 is illustrated, but the present disclosure is not limited thereto, and in some embodiments, the first electrode ELT1 or the like may be electrically connected to the second electrode ELT2.

In some embodiments, the first and third electrodes ELT1 and ELT3 may each include at least one conductive material. For example, each of the first and third electrodes ELT1 and ELT3 may include at least one metal of various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and/or copper (Cu), or an alloy including the same; a conductive oxide such as an indium tin oxide (ITO), an indium zinc oxide (IZO), an indium tin zinc Oxide (ITZO), a zinc oxide (ZnO), an aluminum zinc oxide (AZO), a gallium zinc oxide (GZO), a zinc tin oxide (ZTO), a gallium tin oxide (GTO), and/or a fluorine tin oxide (FTO); and at least one conductive material among conductive polymers such as PEDOT, but the present disclosure is not limited thereto. For example, each of the first and third electrodes ELT1 and ELT3 may contain other conductive materials in addition to a carbon nanotube or graphene. In addition, each of the first and third electrodes ELT1 and ELT3 may be configured of a single layer or multilayer. For example, each of the first and third electrodes ELT1 and ELT3 may include a reflective electrode layer containing a reflective conductive material. In addition, each of the first and third electrodes ELT1 and ELT3 may selectively further include at least one of at least one transparent electrode layer located at an upper portion and/or a lower portion of the reflective electrode layer, and at least one conductive capping layer covering an upper portion of the reflective electrode layer and/or the transparent electrode layer.

The light emitting elements LD1 and LD2 may be located on the first and third electrodes ELT1 and ELT3, respectively. Meanwhile, in FIG. 9 to FIG. 11, the case in which the light emitting elements LD1 and LD2 are connected between the first power source VDD and the second power source VSS in a forward direction is illustrated, but each pixel PXL may further include the light emitting elements connected in a reverse direction. Hereinafter, for better understanding and ease of description, the case in which the light emitting elements LD1 and LD2 are connected between the first power source VDD and the second power source VSS in a forward direction will be mainly described.

In some embodiments, the light emitting elements LD1 and LD2 may be directly located on the first and third electrodes ELT1 and ELT3, respectively. The light emitting elements LD1 and LD2 may be supplied to an upper portion of the passivation layer PSV to be aligned by an alignment signal (or alignment voltage) that is applied to the first and third electrodes ELT1, ELT2, and ELT3. For example, the light emitting elements LD1 and LD2 may be supplied through an inkjet method, a slit coating method, or other various methods, and may be aligned with directionality by the electric field formed between the first to third electrodes ELT1, ELT2, and ELT3. In this case, the first light emitting element LD1 may be aligned to be adjacent to the first electrode ELT1, and the second light emitting element LD2 may be aligned to be adjacent to the third electrode ELT3. For example, as shown in FIG. 9 and FIG. 10, the first light emitting element LD1 may be located on one side of the first electrode ELT1, and one end of the electrode layer 14 of the first light emitting element LD1 may directly contact the first electrode ELT1.

In addition, the second light emitting element LD2 may be located on one side of the third electrode ELT3, and one end of the first semiconductor layer 11 of the second light emitting element LD2 may directly contact the third electrode ELT3. However, the present disclosure is not limited thereto, and, as shown in FIG. 11, the first light emitting element LD1 may be located on the first electrode ELT1 so as to at least partially overlap the first electrode ELT1. In this case, a side portion of the electrode layer 14 of the first light emitting element LD1 may directly contact the first electrode ELT1. In this case, the side portion of the electrode layer 14 of the first light emitting element LD1 may be exposed by the insulation layer INF to enable contact between the electrode layer 14 of the first light emitting element LD1 and the first electrode ELT1.

In addition, the second light emitting element LD2 may be located on the third electrode ELT3 so as to at least partially overlap the third electrode ELT3. In this case, a side portion of the first semiconductor layer 11 of the second light emitting element LD2 may directly contact the third electrode ELT3. In this case, the side portion of the first semiconductor layer 11 of the second light emitting element LD2 may be exposed by the insulation layer INF to enable contact between the first semiconductor layer 11 of the second light emitting element LD2 and the third electrode ELT3.

As described above, when the light emitting elements LD1 and LD2 are respectively directly located on the first and third electrodes ELT1 and ELT3, the first light emitting element LD1 may be directly connected to the first electrode ELT1, and the second light emitting element LD2 may be directly connected to the third electrode ELT3. Accordingly, because a separate contact electrode for electrically connecting the light emitting elements LD1 and LD2 to the first electrode ELT1 or the third electrode ELT3 may be omitted, the number of masks may be reduced, thereby reducing costs and simplifying the manufacturing process.

The contact electrode CNE for electrically connecting the first and second light emitting elements LD1 and LD2 may be located on the first and second light emitting elements LD1 and LD2. For example, one side of the contact electrode CNE may contact the first semiconductor layer 11 of the first light emitting element LD1, and the other side of the contact electrode CNE may contact the electrode layer 14 of the second light emitting element LD2. Accordingly, the first and second light emitting elements LD1 and LD2 may be connected in series between the first electrode ELT1 and the second electrode ELT2 through the contact electrode CNE.

The contact electrode CNE may be made of various transparent conductive materials. For example, the contact electrode CNE may include at least one of various transparent materials such as an indium tin oxide (ITO), an indium zinc oxide (IZO), an indium tin zinc oxide (ITZO), a zinc oxide (ZnO), an aluminum zinc oxide (AZO), a gallium zinc oxide (GZO), a zinc tin oxide (ZTO), a gallium tin oxide (GTO), or a fluorine tin oxide (FTO), and they may be implemented to be substantially transparent or translucent to satisfy a predetermined transmittance. Accordingly, the light emitted from the light emitting elements LD1 and LD2 may transmit through the contact electrode CNE to be emitted to the outside of the display panel PNL.

In some embodiments, the contact electrode CNE may be first deposited on the front surface of the substrate SUB, and then patterned by securing an overlay margin. Accordingly, even if there is a length deviation between the light emitting elements LD1 and LD2, an overlay margin may be secured to stably form the contact electrode CNE. In addition, after the alignment of the light emitting elements LD1 and LD2 is completed, the contact electrode CNE may reduce or prevent deviation of the light emitting elements LD1 and LD2 from the aligned positions. Accordingly, because a structure for fixing the light emitting elements LD1 and LD2 may be omitted, the number of masks may be reduced, thereby reducing costs, and simplifying the manufacturing process.

An insulation layer INS may be located on the contact electrodes CNE. For example, the insulation layer INS may directly cover the first and third electrodes ELT1 and ELT3, the light emitting elements LD1 and LD2, and the contact electrode CNE.

The insulation layer INS may include at least one layer of an inorganic film and/or organic film. The insulation layer INS may be formed as a single layer or as a multilayer, and may include at least one inorganic insulating material and/or organic insulating material. For example, the insulation layer INS may include a silicon nitride (SiNx), a silicon oxide (SiOx), a silicon oxynitride (SiOxNy), a titanium oxide (TiOx), or an aluminum oxide (AlOx), and various types of organic/inorganic insulating materials.

In some embodiments, the insulation layer INS may include a thin film encapsulation layer of a multi-layered structure. For example, the insulation layer INS may include a thin film encapsulation layer of a multi-layered structure that includes at least two inorganic insulation layers and at least one organic insulation layer interposed between the inorganic insulation layers. However, the present disclosure is not necessarily limited thereto, and the material and/or structure of the insulation layer INS may be variously changed.

According to the display device of some embodiments described above, the first to third electrodes ELT1, ELT2, and ELT3 for aligning the light emitting elements LD1 and LD2 are configured as a plurality of conductive layers, so that short-circuit defects that may occur due to the space limits between the first to third electrodes ELT1, ELT2, and ELT3 may be reduced or minimized. Therefore, because a pixel area of each pixel PXL may be more efficiently utilized, a high resolution and fine pitch display device may be realized.

Hereinafter, other embodiments will be described. The same elements as those described above will be referred to the same reference numerals in embodiments below, and redundant descriptions will be omitted or simplified.

Figure 12:
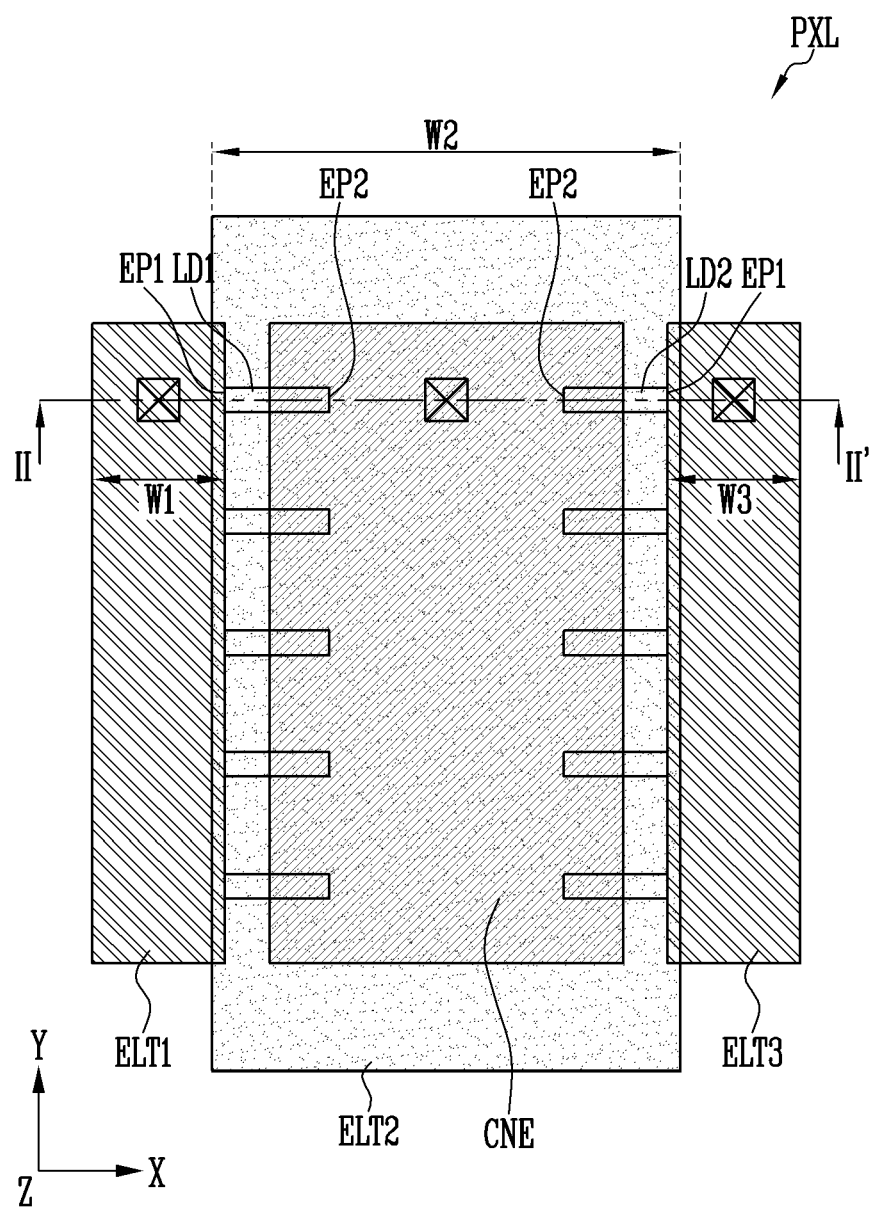
FIG. 12 illustrates a top plan view of a pixel according to other embodiments.
Figure 13:
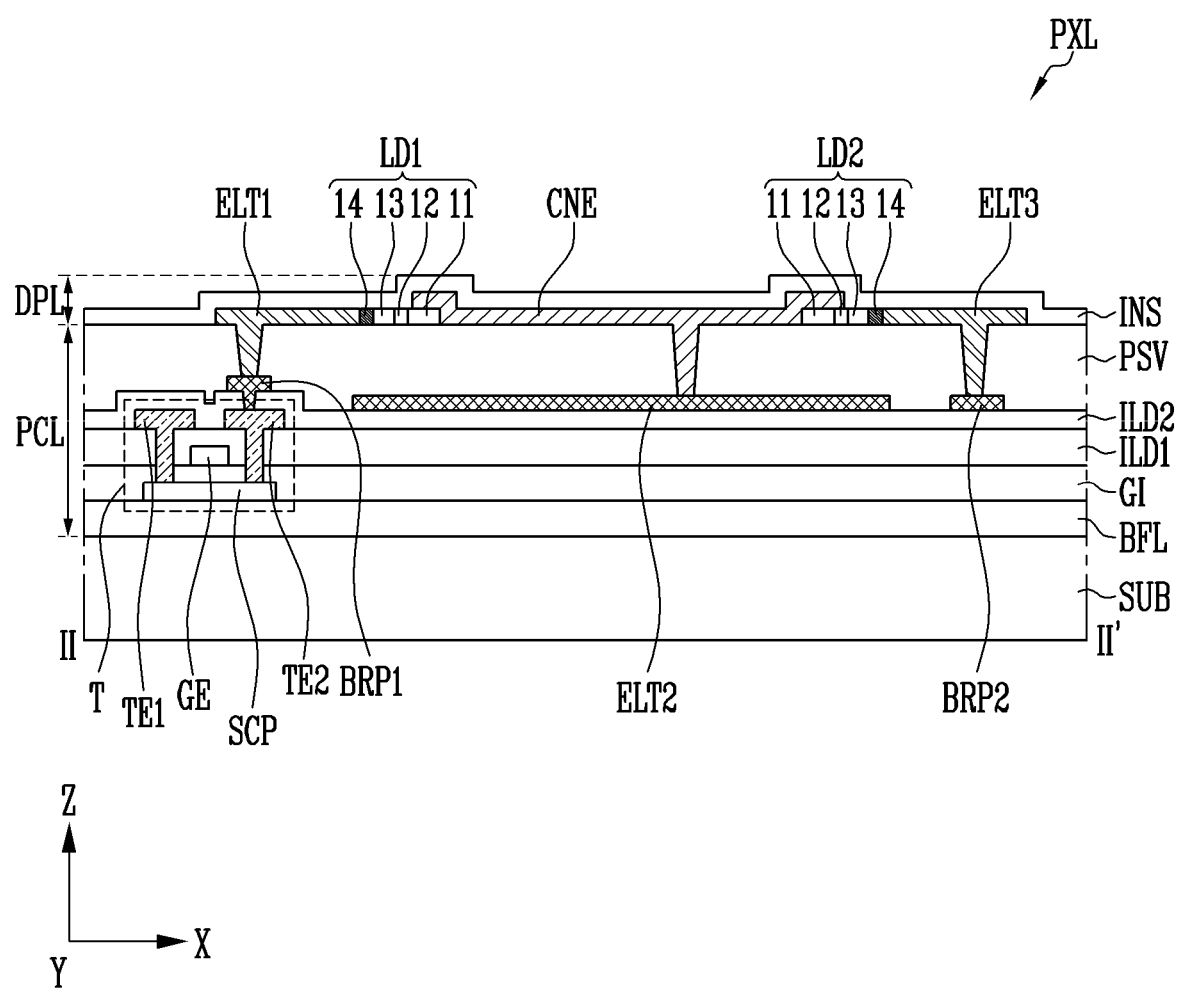
FIG. 13 illustrates a cross-sectional view taken along the line II-II' of FIG. 12.

FIG. 12 illustrates a top plan view of a pixel according to other embodiments. FIG. 13 illustrates a cross-sectional view taken along the line II-II' of FIG. 12.

Referring to FIG. 12 and FIG. 13, the display device according to some embodiments is different from that of embodiments of FIG. 1 to FIG. 11, in that the contact electrode CNE is located between the first electrode ELT1 and the third electrode ELT3 to be directly connected to the second electrode ELT2.

For example, the contact electrode CNE may be located between the first electrode ELT1 and the third electrode ELT3 so as to be spaced apart from the first and third electrodes ELT1 and ELT3. The first light emitting element LD1 may be located between the contact electrode CNE and the first electrode ELT1, and the second light emitting element LD2 may be located between the contact electrode CNE and the third electrode ELT3.

The first and second light emitting elements LD1 and LD2 may be respectively electrically connected between the first electrode ELT1 and the second electrode ELT2 and between the third electrode ELT3 and the second electrode ELT2.

For example, the first end portion EP1 of the first light emitting element LD1 may be electrically connected to the first electrode ELT1. The first end portion EP1 (or electrode layer 14) of the first light emitting element LD1 may be directly located on the first electrode ELT1 to contact the first electrode ELT1. Accordingly, the first end portion EP1 of the first light emitting element LD1 may be electrically connected to a first bridge pattern BRP1 through the first electrode ELT1, and thus, may be connected to the first power source VDD. In addition, the second end portion EP2 (or first semiconductor layer 11) of the first light emitting element LD1 may be electrically connected to the second electrode ELT2 through the contact electrode CNE, and thus, may be connected to the second power source VSS.

The first end portion EP1 (or electrode layer 14) of the second light emitting element LD2 may be directly located on the third electrode ELT3 to contact the third electrode ELT3. Accordingly, the first end portion EP1 of the second light emitting element LD2 may be electrically connected to a second bridge pattern BRP2 through the third electrode ELT3, and thus, may be connected to the first power source VDD. In some embodiments, the second bridge pattern BRP2 may be integrally formed with the above-described first bridge pattern BRP1, or may be electrically connected to the first bridge pattern BRP1 via another conductive layer. In addition, the second end portion EP2 (or first semiconductor layer 11) of the second light emitting element LD2 may be electrically connected to the second electrode ELT2 through the contact electrode CNE, and thus, may be connected to the second power source VSS. The contact electrode CNE may contact the second electrode ELT2 through a contact hole penetrating through the passivation layer PSV. That is, the first and second light emitting elements LD1 and LD2 may be connected in parallel between respective ones of the first to third electrodes ELT1, ELT2, and ELT3 through the contact electrode CNE.

In some embodiments, a width W2 in the first direction (X-axis direction) of the second electrode ELT2 may be sufficiently wide so that the second electrode ELT2 overlaps the first and second light emitting elements LD1 and LD2. That is, the second electrode ELT2 may overlap the first and second light emitting elements LD1 and LD2 in the third direction (Z-axis direction). In this case, the second electrode ELT2 may function as a reflective member. That is, the second electrode ELT2 is located under the light emitting elements LD1 and LD2 to reflect light, which is emitted from a lower portion of the light emitting elements LD1 and LD2, to the front of the display panel PNL, that is, to the third direction (Z-axis direction), thereby improving light efficiency of the front surface of the display panel PNL.

In some embodiments, when the width W2 in the first direction (X-axis direction) of the second electrode ELT2 is widened, the second electrode ELT2 at least partially overlaps the first electrode ELT1 and/or the third electrode ELT3 in the third direction (Z-axis direction). In addition, the second electrode ELT2 may overlap the contact electrode CNE in the third direction (Z-axis direction). FIG. 12 illustrates the case in which the second electrode ELT2 overlaps the entire contact electrode CNE, but the present disclosure is not limited thereto, and the second electrode ELT2 may overlap a portion of the contact electrode CNE. Meanwhile, as the first to third electrodes ELT1, ELT2, and ELT3 are configured of a plurality of conductive layers, short-circuit defects that may occur due to the space limits between the first to third electrodes ELT1, ELT2, and ELT3 may be reduced or minimized, and thus a high resolution and fine pitch display device may be realized as described above.

Meanwhile, in FIG. 13, the structure in which the contact electrode CNE is electrically connected to the second electrode ELT2 is illustrated, but the present disclosure is not limited thereto, and in some embodiments, the first electrode ELT1 or the like may be electrically connected to the second electrode ELT2.

Figure 14:
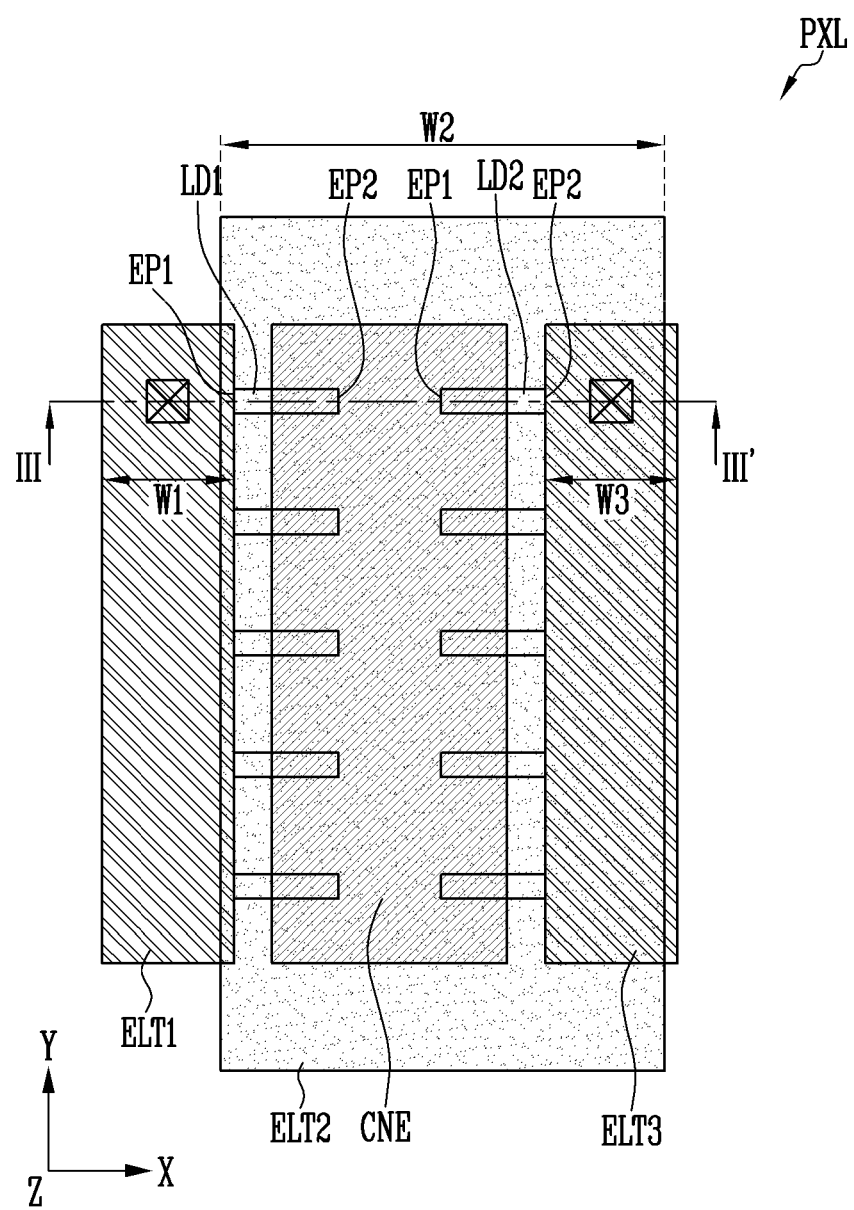
FIG. 14 illustrates a top plan view of a pixel according to other embodiments.
Figure 15:
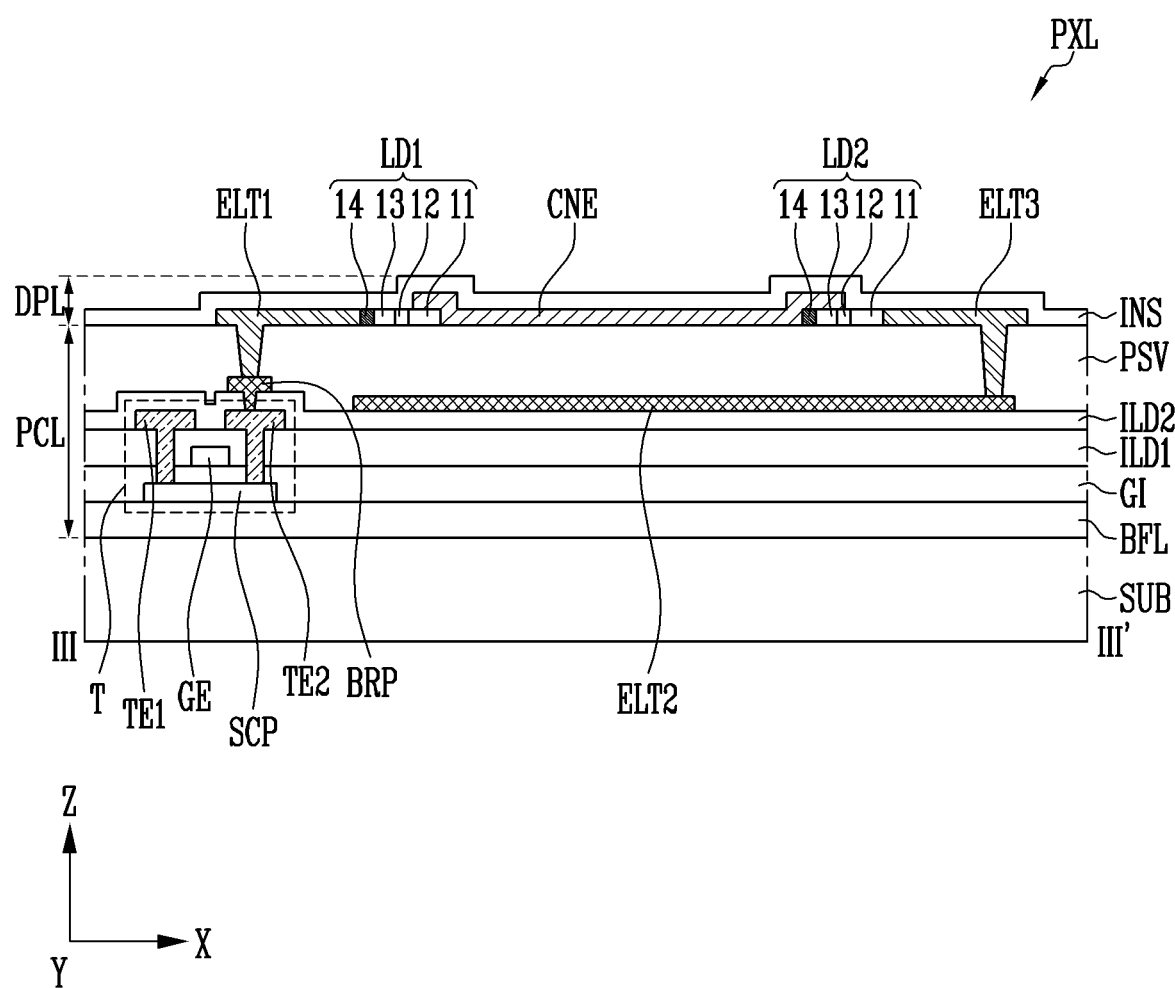
FIG. 15 illustrates a cross-sectional view taken along the line III-III' of FIG. 14.

FIG. 14 illustrates a top plan view of a pixel according to other embodiments. FIG. 15 illustrates a cross-sectional view taken along the line III-III' of FIG. 14.

Referring to FIG. 14 and FIG. 15, the display device according to some embodiments is different from that of embodiments of FIG. 12 and FIG. 13, in that the contact electrode CNE is located between the first electrode ELT1 and the third electrode ELT3, while the third electrode ELT3 is directly connected to the second electrode ELT2.

For example, the contact electrode CNE may be located between the first electrode ELT1 and the third electrode ELT3 so as to be spaced apart from the first and third electrodes ELT1 and ELT3. The first light emitting element LD1 may be located between the contact electrode CNE and the first electrode ELT1, and the second light emitting element LD2 may be located between the contact electrode CNE and the third electrode ELT3.

The first and second light emitting elements LD1 and LD2 may be electrically connected between the first electrode ELT1 and the second electrode ELT2. For example, the first end portion EP1 (or electrode layer 14) of the first light emitting element LD1 may be electrically connected to the first electrode ELT1. The first end portion EP1 of the first light emitting element LD1 may be directly located on the first electrode ELT1 to contact the first electrode ELT1.

In addition, the second end portion EP2 (or first semiconductor layer 11) of the first light emitting element LD1 may be electrically connected to the first end portion EP1 (or electrode layer 14) of the second light emitting element LD2 through the contact electrode CNE. That is, one side of the contact electrode CNE may contact the second end portion EP2 of the first light emitting element LD1, and the other side of the contact electrode CNE may contact the first end portion EP1 of the second light emitting element LD2. Accordingly, the contact electrode CNE may electrically connect the second end portion EP2 of the first light emitting element LD1 and the first end portion EP1 of the second light emitting element LD2.

In addition, the second end portion EP2 (or first semiconductor layer 11) of the second light emitting element LD2 may be electrically connected to the third electrode ELT3. The second end portion EP2 of the second light emitting element LD2 may be directly located on the third electrode ELT3 to contact the third electrode ELT3. The third electrode ELT3 can be electrically connected to the second electrode ELT2 through the contact hole. That is, the first and second light emitting elements LD1 and LD2 may be connected in series between the first electrode ELT1 and the second electrode ELT2 through the contact electrode CNE. As such, the light emitting elements LD1 and LD2 connected between the first electrode ELT1 and the second electrode ELT2 may configure a light source of each pixel PXL.

In some embodiments, the width W2 in the first direction (X-axis direction) of the second electrode ELT2 may be sufficiently wide so that the second electrode ELT2 overlaps the first and second light emitting elements LD1 and LD2. That is, the second electrode ELT2 may overlap the first and second light emitting elements LD1 and LD2 in the third direction (Z-axis direction). In this case, the second electrode ELT2 may function as a reflective member. That is, the second electrode ELT2 is located under the light emitting elements LD1 and LD2 to reflect light, which is emitted to a lower portion of the light emitting elements LD1 and LD2, to the front of the display panel PNL, that is, to the third direction (Z-axis direction), thereby improving light efficiency of the front surface of the display panel PNL, as described above.

In some embodiments, when the width W2 in the first direction (X-axis direction) of the second electrode ELT2 is widened, the second electrode ELT2 at least partially overlaps the first electrode ELT1 and/or the third electrode ELT3 in the third direction (Z-axis direction). In addition, the second electrode ELT2 may overlap the contact electrode CNE in the third direction (Z-axis direction). Meanwhile, as the first to third electrodes ELT1, ELT2, and ELT3 are configured of a plurality of conductive layers, short-circuit defects that may occur due to the space limits between the first to third electrodes ELT1, ELT2, and ELT3 may be reduced or minimized, and thus a high resolution and fine pitch display device may be realized, as described above.

Those skilled in the art related to the present disclosure will readily appreciate that many modifications are possible without materially departing from the novel teachings and advantages. The embodiments should be considered in a descriptive sense only and not for purposes of limitation. The scope of the present disclosure, not by the detailed description given in the appended claims, with functional equivalents thereof to be included therein, and all differences within the equivalent scope will be construed as being included in the present disclosure.

What is claimed is:
1. A display device comprising:
   a substrate;
   a passivation layer above a substantial entirety of the substrate;
   a first electrode extending in a first direction above the passivation layer, and having a first width in a second direction crossing the first direction in plan view;

a second electrode extending in the first direction entirely below the passivation layer, and having a second width in the second direction in plan view that is greater than the first width;
a first light emitting element on a same layer as the first electrode; and
a contact electrode on the first light emitting element,
wherein one end of the first light emitting element contacts the first electrode, and another end of the first light emitting element contacts the contact electrode.

2. The display device of claim 1, wherein the first electrode at least partially overlaps the second electrode.

3. The display device of claim 1, wherein the first light emitting element at least partially overlaps the second electrode.

4. The display device of claim 1, further comprising the passivation layer between the first electrode and the second electrode.

5. The display device of claim 4, wherein the first electrode is directly on the passivation layer.

6. The display device of claim 5, wherein the first light emitting element is directly on the passivation layer.

7. The display device of claim 1, further comprising
a third electrode on the substrate; and
a second light emitting element on the third electrode.

8. The display device of claim 7, wherein one end of the second light emitting element contacts the third electrode, and another end of the second light emitting element contacts the contact electrode.

9. The display device of claim 7, wherein the first electrode and the third electrode are on a same layer.

10. A display device comprising:
a substrate;
a first electrode extending in a first direction on the substrate, and having a first width in a second direction crossing the first direction in plan view;
a second electrode extending in the first direction between the substrate and the first electrode, and having a second width in the second direction in plan view that is greater than the first width;
a first light emitting element on a same layer as the first electrode, and having a one end contacting the first electrode;
a third electrode on the substrate;
a second light emitting element on the third electrode; and
a contact electrode on the first light emitting element, contacting another end of the first light emitting element, and surrounding the third electrode in plan view.

11. The display device of claim 10, wherein the third electrode overlaps the second electrode.

12. The display device of claim 7, wherein the contact electrode is between the first electrode and the third electrode.

13. The display device of claim 12, wherein the contact electrode overlaps the second electrode.

14. The display device of claim 7, further comprising the passivation layer between the second electrode and the third electrode.

15. The display device of claim 14, wherein the third electrode contacts the second electrode through a contact hole penetrating through the passivation layer.

16. The display device of claim 7, wherein at least one of the first electrode, the third electrode, or the contact electrode is electrically connected to the second electrode.

17. The display device of claim 1, further comprising an insulation layer directly covering the first electrode and the contact electrode.

18. The display device of claim 1, wherein the first light emitting element includes a semiconductor core, and an electrode layer on one side of the semiconductor core and contacting the first electrode.

19. The display device of claim 18, wherein the semiconductor core includes a first semiconductor layer, a second semiconductor layer on the first semiconductor layer, and an active layer between the first semiconductor layer and the second semiconductor layer.

20. The display device of claim 1, further comprising
a gate electrode on the substrate;
a semiconductor pattern on the gate electrode; and
a source electrode and a drain electrode on the semiconductor pattern,
wherein the second electrode is on a same layer as the source electrode and the drain electrode.

* * * * *